US006930924B2

United States Patent
Takase et al.

(10) Patent No.: US 6,930,924 B2
(45) Date of Patent: Aug. 16, 2005

(54) NONVOLATILE MEMORY AND METHOD OF PROGRAMMING THE SAME MEMORY

(75) Inventors: Yoshinori Takase, Tokyo (JP); Shoji Kubono, Ome (JP); Michitaro Kanamitsu, Ome (JP); Atsushi Nozoe, Hino (JP); Keiichi Yoshida, Atsugi (JP); Hideaki Kurata, Kokubunji (JP)

(73) Assignees: Renesas Technology Corp., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 0 days.

(21) Appl. No.: 10/404,101

(22) Filed: Apr. 2, 2003

(65) Prior Publication Data

US 2003/0202392 A1 Oct. 30, 2003

Related U.S. Application Data

(63) Continuation of application No. 10/012,549, filed on Dec. 12, 2001, now Pat. No. 6,567,315.

(30) Foreign Application Priority Data

Dec. 22, 2000 (JP) ........................................ 2000-391229

(51) Int. Cl.$^7$ ............................................... G11C 16/04
(52) U.S. Cl. ............................. 365/185.28; 365/185.18
(58) Field of Search ...................... 365/185.18, 185.22, 365/185.28

(56) References Cited

U.S. PATENT DOCUMENTS 5,748,538 A    5/1998  Lee et al. ............... 365/185.06
6,034,892 A    3/2000  Choi ...................... 365/185.14
6,091,640 A  * 7/2000  Kawahara et al. ..... 365/185.28
6,212,100 B1   4/2001  Choi ...................... 365/185.14
6,307,780 B1  10/2001  Tanaka et al. ......... 365/185.13
6,459,114 B1 * 10/2002  Nakamura et al. .......... 257/298
6,618,292 B2 * 9/2003  Sakui .................... 365/185.29
2001/0004325 A1  6/2001  Choi ...................... 365/185.14

* cited by examiner

Primary Examiner—Son Mai
(74) Attorney, Agent, or Firm—Miles & Stockbridge P.C.

(57) ABSTRACT

There is provided a method of programming a non-volatile memory which can solve the problem of the data write system of the existing flash memory that a load capacitance of bit lines becomes large, the time required by the bit lines to reach the predetermined potential becomes longer, thereby the time required for data write operation becomes longer and power consumption also becomes large because the more the memory capacitance of memory array increases, the longer the length of bit lines becomes and the more the number of bit lines increases. In the non-volatile memory of the invention comprising the AND type memory array in which a plurality of memory cells are connected in parallel between the local bit lines and local drain lines, the local drain lines are precharged by supplying thereto a comparatively higher voltage from the common drain line side (opposite side of the main bit lines), the main bit lines are selectively precharged by applying thereto the voltage of 0V or a comparatively small voltage depending on the write data and thereafter a drain current is applied only to the selected memory cells to which data is written by applying the write voltage to the word lines in order to implant the hot electrons to the floating gate.

15 Claims, 16 Drawing Sheets

|  | DL(L) | G-B.L.(L) | SL(L) | SL(R) | G-B.L.(R) | DL(R) |
|---|---|---|---|---|---|---|
| "01" | L |  | H | L |  | H |
| "00" | H |  | L | H |  | H |
| "10" | L |  | L | H |  | L |
| "11" | L |  | L | H |  | H |

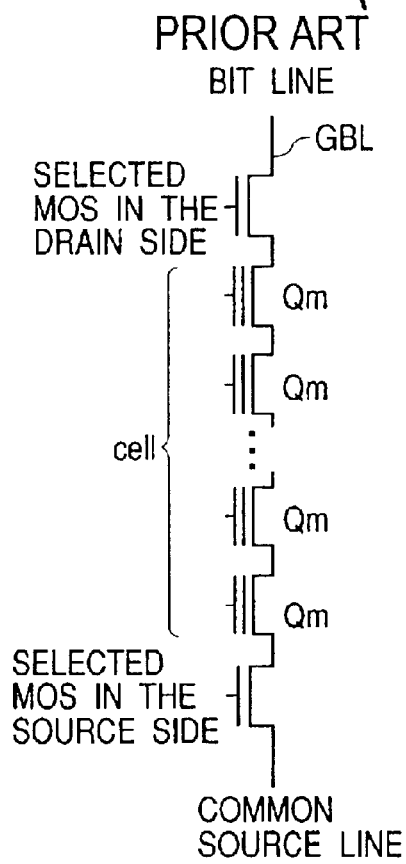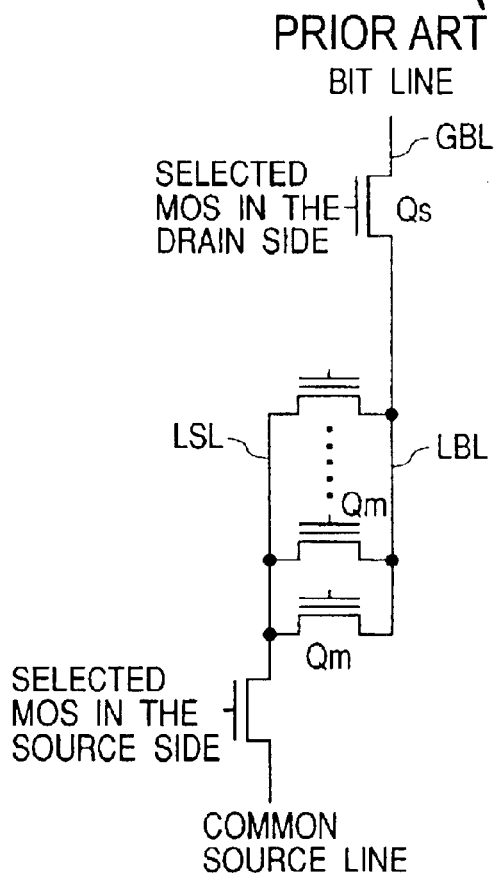
FIG. 17(A) PRIOR ART
FIG. 17(B) PRIOR ART

NONVOLATILE MEMORY AND METHOD OF PROGRAMMING THE SAME MEMORY

CROSS-REFERENCE TO RELATED APPLICATION

This application is a continuation of application Ser. No. 10/012,549 filed Dec. 12, 2001 now U.S. Pat. No. 6,567,315.

BACKGROUND OF THE INVENTION

The present invention relates to a technique that can be effectively adapted to a write control system in an electrically erasable and programmable non-volatile memory and more specifically to a technique that can be effectively adapted to a flash memory being capable of simultaneously erasing data, for example, in a predetermined unit.

A flash memory uses, as a memory cell, a non-volatile memory element consisting of a MOSFET of the double-gate structure including a control gate and a floating gate. The write system in the flash memory has been sorted to a system utilizing the FN tunnel phenomenon and a hot-electron system. In the system utilizing the FN tunnel phenomenon, a voltage is applied across the control gate and substrate (or well region) or across the control gate and source or drain and a threshold voltage is changed through implantation or release of charges to and from the floating gate by utilizing the FN tunnel phenomenon.

Meanwhile, in the system utilizing the hot-electron, a threshold voltage is changed through implantation into the floating gate of hot electrons generated in the channel by applying a current across the source and drain under the condition that a high voltage is impressed to the control gate. In the case of the hot-electron system, the charges are generally extracted from the floating gate in the FN tunnel. Moreover, a flash memory is often structured so that data is erased, even when any write system is employed, in unit of memory cell (sector) connected to only one word line or in unit of a plurality of sectors (blocks) using in common the well region and source lines.

SUMMARY OF THE INVENTION

FIGS. 16(A) and 16(B) show an example of voltage applied to a memory cell in the write system utilizing the FN tunnel (system for raising a threshold voltage of the memory cell by write operation). FIG. 16(A) shows voltage applied to a memory cell for selection, namely for write operation, while FIG. 16(B) shows voltage applied to a memory cell for no-selection, namely for no-write operation. As shown in FIGS. 16(A) and 16(B), the voltage of 0V is applied to the source and drain of the selected memory cell, while the write rejection voltage of 5V is applied to the source and drain of the non-selected memory cell.

A flash memory may be sorted to a memory array called the NAND type memory in which memory elements Qm are connected in series as shown in FIG. 17(A) and a memory array called the AND type memory in which memory elements Qm are connected in parallel as shown in FIG. 17(B).

Of the flash memories explained above, the AND type memory array is often structured, as shown in FIG. 17(B) in the manner that the local bit line LBL to which the drains of the memory elements Qm are connected is connected to the main bit line GBL via the selected MOSFET Qs. In such a memory array, when the write system as shown in FIG. 16 is employed, if a write rejection voltage of 5V is applied to the memory element Qm via the main bit line and local bit line depending on the write data, the more the memory capacity of memory array increases, the longer the bit line becomes and the more the number of bit lines increases. Accordingly, there arises a problem that a load capacitance of bit line becomes larger, the time required until the bit line reaches the predetermined potential becomes larger, and thereby the time required for write operation also becomes longer and power consumption also becomes high.

Moreover, in the memory array wherein the write rejection voltage is generated within an internal power supply circuit such as a voltage-boosting circuit, if a load capacitance of bit line increases, the power supply capability of the internal power supply circuit must be intensified. Therefore, the occupation area of circuit becomes larger and thereby a chip size is also increased. Moreover, when the write system by the FN tunnel is employed, there exists a problem that the scale-down of memory element becomes difficult and integration degree cannot be improved because an element isolation region must be provided among the cells for insulation between memory cells and the dielectric strength of elements forming a memory cell must be further raised in comparison with the hot-electron system.

It is therefore an object of the present invention to provide a non-volatile memory such as a flash memory that can reduce the total write operation time.

It is another object of the present invention to provide a non-volatile memory such as a flash memory that can reduce the power consumption.

It is further object of the present invention to provide a non-volatile memory that can improve the integration degree of a memory array.

The aforementioned and the other objects and novel features of the present invention will become more apparent from the description of the present invention and the accompanying drawings.

The summary of the present invention disclosed in this specification will be explained below.

Namely, in the write method of a non-volatile memory including a memory array comprising a plurality of word lines and bit lines and a plurality of memory cell lines, a plurality of memory cells connected to any one of word lines are connected in parallel in each memory cell line, and connecting a first common connection node of each memory cell line to the bit lines via first switch means and a second common connection node of the memory cell lines to a common voltage supply line via second switch means, after the first common connection node of the memory cell lines is charged via the second switch means with a first voltage for write operation, at the time of write operation, from the common voltage supply line in the opposite direction to the bit lines, a second voltage lower than the first voltage is selectively applied to the bit lines depending on the write data and a current is applied to the memory cells to be selected while the charged first voltage is discharged by controlling the first and second switch means, and after a current is not applied to the non-selected memory cells that are not the write operation object, the write operation is conducted selectively to the memory cells by applying the third voltage for write operation to any lines among the word lines.

In more detail, in the non-volatile memory including the so-called AND type memory array in which a plurality of memory cells are connected in parallel between the local bit lines and local drain lines, a switch MOSFET which can short-circuit between the local bit line and local drain line is provided to precharge the local bit line and local drain line by supplying a write rejection voltage from the side of common drain line (opposite side of the main bit line). Thereafter, the charges used for precharge of the local bit line connected to the selected memory cells for the write operation are pulled toward the main bit line by selectively making conductive the selected MOSFET through application of 0V or the voltage smaller than the write rejection voltage to the main bit line depending on the write data and also application of the voltage, similar to the application voltage to the main bit line, to the gate of the selected MOSFET between the local bit line and main bit line. Subsequently, electrons are implanted to the floating gate with the FN tunnel in the selected memory cells to which the data is written by applying the write voltage to the word lines.

According to the means explained above, the precharge up to the write rejection voltage is required for the write operation only to the local bit lines and local drain lines having comparatively lower parasitic capacitance. In this case, since it is enough for the main bit line to raise the voltage thereof up to the voltage lower than the write rejection voltage, the time required for precharge of the main bit line can be reduced to improve the write operation speed and the load capacitance of the internal power supply circuit during the write operation can be reduced to remarkably lower the power consumption in comparison with the method of related art in which the main bit line is precharged up to the write rejection voltage.

Moreover, in above case, the voltage of a control signal for making conductive the selected MOSFET as the third switch means is set to the voltage level which is identical or higher than the second voltage to be applied to the bit lines depending on the write data. Thereby, the selected MOSFET provided as the third switch means can be controlled selectively to the conductive state corresponding to the bit lines to which the voltage is selectively applied in order to conduct the write operation only to the desired memory cells by selectively lowering the write voltage of the local bit lines.

Moreover, after the above write operation, the bit lines are discharged and the potential of the common voltage supply line is switched to the ground potential to set the selected MOSFETs as the first and second switch means to the conductive state. Thereby, the write operation can be shifted to the read operation to verify the write operation after discharging the local bit line as the first common connection node and the local drain line as the second common connection node. Accordingly, the transfer control to the read operation to verify the write operation can be simplified and the operation can be quickly transferred to the read operation for verification after the write operation.

In addition, in the so-called AG-AND type non-volatile memory in which a memory cell is composed of a switch element and a memory element connected in series among the local bit lines or local drain lines, after a comparatively higher voltage for write operation is applied, at the time of write operation, to the main bit line and the local drain line in the opposite side from the common voltage supply line under the condition that the switch element is turned OFF and a comparatively smaller voltage is selectively applied for the charging purpose, depending on the write data to the local bit lines connected to the main bit line, a high voltage is applied for the write operation to any lines of the word lines and the switch element in series with the memory elements is set to the conductive state, a current is applied to the selected memory cells as the write operation object and a current is not applied to the non-selected memory cells which are not the write operation object, and thereby the write operation is conducted selectively to the memory cells.

Even depending on the means explained above, since precharge up to the comparatively higher voltage is required for the write operation to the local drain line having comparatively lower parasitic capacitance and it is required for the main bit line and local bit lines to raise the voltage which is lower than the write voltage of the local drain lines, the write operation speed can further be improved by shortening the time required for precharge of main bit line and power consumption can also be remarkably reduced by lowering the load capacitance of the internal power supply circuit during the write operation in comparison with the related art in which the main bit line is precharged up to the drain voltage.

Moreover, the potential of the control signal for making conductive the switch element connected in serial with the memory element during the write operation is set almost identical to the voltage to be applied to the bit line. Thereby, the switch element in series with the memory element can be selectively made conductive corresponding to the main bit line to which the voltage is selectively applied and thereby the write operation can be conducted only to the desired memory cells.

In addition, after the write operation explained above, the bit lines are discharged and the potential of the common voltage supply line is switched to the ground potential to discharge the local drain lines as the first common connection node and the second common connection node. Thereafter, the operation is transferred to the read operation to verify the write operation. Thereby, the transfer control to the read operation to verify the write operation can be simplified and the operation can be quickly transferred to the read operation to verify the write operation after the end of write operation.

Moreover, in the structure that two memory cell lines can be connected to the bit line (main bit line) via the first switch means, when the first common connection nodes of the memory cell lines of the odd numbers are connected to the bit line via the first switch means, the second common connection nodes are connected to the common voltage supply line with the second switch means and when the second common connection nodes of the memory cell lines of the even numbers are connected to the bit lines with the first switch means, the second common connection nodes are connected to the common voltage supply line with the first switch means. Thereby, the bit lines can be used in common for the memory cell lines of odd numbers and the memory cell lines of the even numbers, the number of total bit lines and capacitance of bit lines can be reduced and moreover the write operation speed can be lowered and the power consumption can also be reduced.

Moreover, in the structure to simultaneously conduct the erase operation for all memory cell lines connected to the selected word lines, the write operation is conducted simultaneously to the all memory cell lines of odd numbers and even numbers connected to the selected word lines. Thereby, even when the bit lines are used in common to the memory cell lines of odd numbers and even numbers, the erase operation can be conducted simultaneously to all memory cell lines connected to only one word line.

Moreover, the directions of a write current of the selected memory cell and a read current to verify the write operation are set identical to the direction of current flowing into the selected memory cells during the write operation. Thereby, data read operation can be performed accurately by avoiding that the threshold voltages of memory cells are different depending on the current flowing direction.

BRIEF DESCRIPTION OF THE DRAWINGS

FIGS. 17(A) and 17(B) are circuit diagrams showing structure examples of the memory arrays in the existing flash memory.

DESCRIPTION OF THE PREFERRED EMBODIMENTS

A preferred embodiment of the present invention will be explained with reference to the accompanying drawings.

Figure 1:
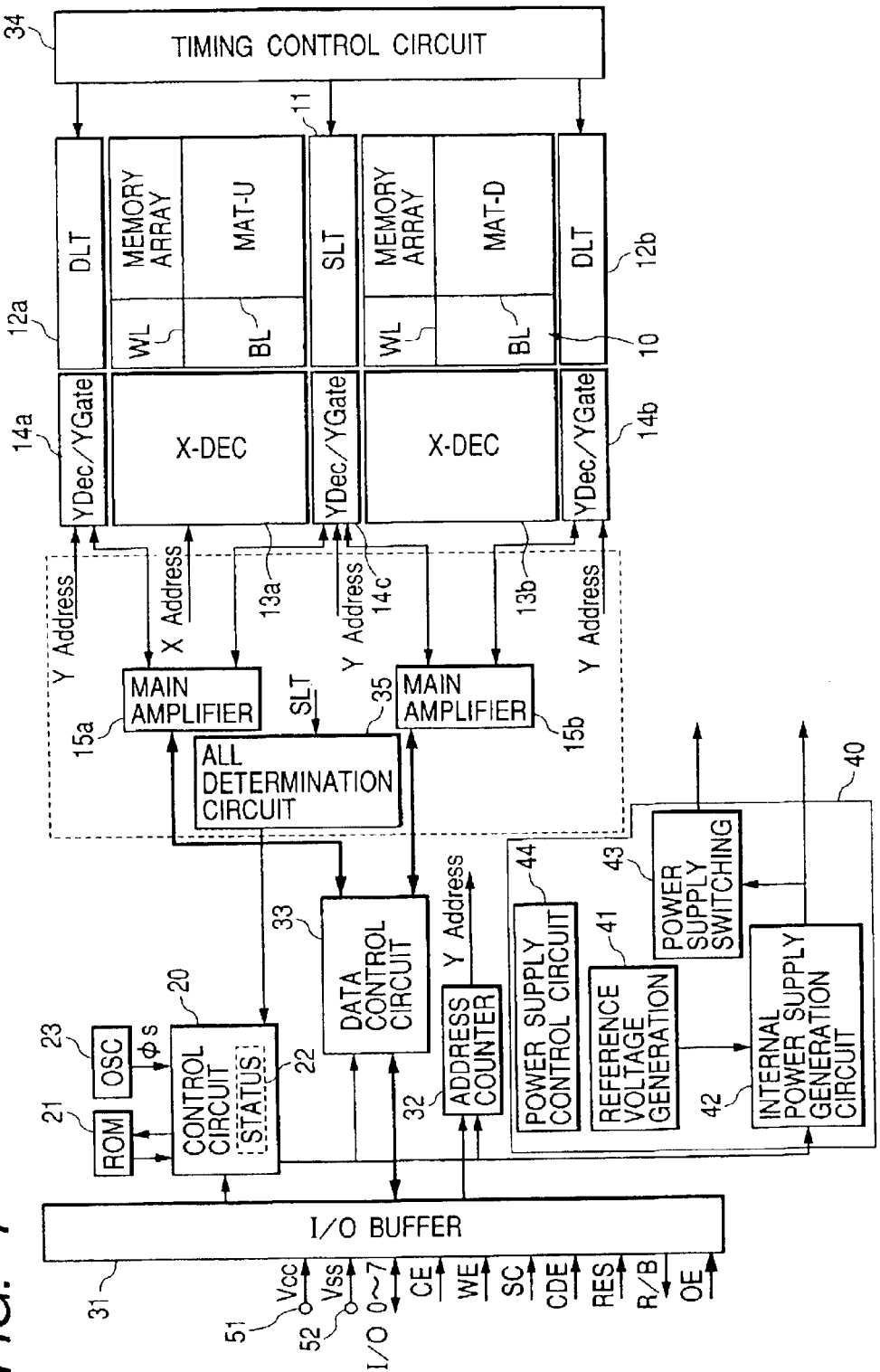
FIG. 1 is a block diagram showing an example of a flash memory as a non-volatile semiconductor memory to which the present invention is adapted.

FIG. 1 is a block diagram of an example of a flash memory as a non-volatile storage device to which the present invention is adapted. Although not particularly restricted, the flash memory of FIG. 1 is structured as a multi-level memory for storing the data of 2-bits in each memory cell and is formed on one semiconductor chip such as a single crystal silicon.

Although not particularly restricted, in the flash memory of FIG. 1, a memory array 10 is structured with two memory mats MAT-U, MAT-D and a sense latch circuit 11 is placed between the mats for amplifying and latching a read signal connected to the bit line BL in each mat and precharging the bit line. A part of this sense latch circuit 11 for amplifying operation and latch operation is called the sense latch and is expressed as SLT. Moreover, data latch circuits 12a, 12b for temporarily holding the read data and precharging the bit lines are respectively placed in the external side of each mat, namely in the opposite side of the sense latch circuit 11 sandwiching the bit line BL.

A part of the data latch circuit 12a, 12b for conducting the latch operation is called the data latch and is expressed as DLT. In this specification, the bit line means, unless otherwise designated particularly, the main bit line connected to the sense amplifier. On the other hand, a local bit line designates the bit line connected indirectly to the sense amplifier via the selected switch and main bit line.

In the embodiment of FIG. 1, a memory cell that is composed of a MOSFET of the double-gate structure including a floating gate and control gate is allocated in the form of a matrix respectively in the memory mats MAT-U and MAT-D. The control gates of the memory cells in the same row are formed continuously to form the word line WL, while the drains of the memory cells in the same column can be connected to the common bit line BL.

Moreover, in the memory array 10, the address decoders (word decoders) 13a, 13b on the X-axis are respectively provided corresponding to each memory mat MAT-U and MAT-D. A word drive circuit for driving one word line WL within each memory mat to the selected level depending on the result of decoding is included in the decoders 13a, 13b.

Reference numerals 14a, 14b, 14c are decoder circuit for decoding the addresses on the Y-axis. Although not shown in FIG. 1, the Y-gates (column switches) which are selectively turned ON or OFF with an output of the decoder to select the latch of the sense latch circuit 11 and data latch circuits 12a, 12b are provided within the sense latch circuit 11 and data latch circuits 12a, 12b. Moreover, 15a, 15b are main amplifiers for transferring the write data inputted from the external circuit to the data latches 12a, 12b and amplifying the read data latched in the data latches 12a, 12b.

The flash memory of FIG. 1 is provided, although not particularly restricted, with a control circuit (sequencer) 20 to interpret a command (instruction) given from an external control apparatus and sequentially form and output a control signal for each circuit within the memory in order to execute the processes corresponding to such command and is also structured to automatically execute the corresponding processes by decoding the given command. The control circuit 20 is provided with a ROM (Read-Only Memory) 21 in which a series microinstruction groups, for example, required for execution of the command are stored and thereby a control signal for each circuit within the chip is formed by sequential execution of the microinstructions.

Moreover, the control circuit 20 is provided with a status register 22 for reflecting the internal condition and thereby generates and outputs, to the external circuit, the ready/busy signal R/B indicating whether access from the external side is possible or not depending on the condition of this status register 22. Moreover, the flash memory of this embodiment is provided with an oscillation circuit 23 and the control circuit 20 is structured to operate synchronously with the system clock signal ?s generated in this oscillation circuit 23.

Moreover, the multi-level flash memory of FIG. 1 is provided with an input/output buffer circuit 31 for fetching the externally inputted data signal, address signal and control signal and outputting the data signal read from the memory array and contents of the status register 22 or the like, an address counter 32 for fetching an externally inputted address signal to generate addresses on the Y-axis through the count-up operation, a data control circuit 33 for converting the externally inputted write data of 2-bit for the multi-level write operation, sharing of the data after conversion to the main amplifiers 15a, 15b and for inverse-conversion of the data read and amplified with the main amplifiers 15a, 15b, a timing control circuit 34 for generating and supplying the operation timing signal for the sense latch circuit 11 and data latch circuits 12a, 12b based on the control signal from the control circuit 20, an all determination circuit 35 for determining whether the write operation is completed or not based on the data read out with the sense latch circuit 11 and a power supply circuit 40 for generating a high voltage to be used for write and erase operations to the memory array 10, or the like. In this embodiment, the data, command and address explained above are formatted so that these are inputted or outputted, on the time division basis, to or from the common input/output terminals I/O0 to I/O7 with the input/output buffer circuit 31.

The power supply circuit 40 is composed of an internal power supply generation circuit 42 consisting of a reference voltage generating circuit 41 for generating the voltage as the reference voltage for the write voltage or the like and a voltage boosting circuit such as a charge-pump for generating the voltages required within the chip such as the write voltage, erase voltage, read voltage and verification voltage or the like based on the power supply voltage Vcc supplied from the extenal circuit, a power supply switching circuit 43 for selecting the desired voltage from these voltages depending on the operating conditions of memory and then supplying the selected voltage to the X decoders 13a, 13b or the like and a power supply control circuit 44 or the like for controlling these circuits. In FIG. 1, numeral 51 designates the power supply voltage terminal to which the power supply voltage Vcc such as 5V or 3.3V, for example, is applied from the external circuit and numeral 52 designates the power supply voltage terminal (ground terminal) to which the ground potential Vss is applied. The peripheral circuits of the memory array except for the circuits which receive the power supply from the power supply circuit operate with the power supply voltage Vcc.

A control signal which is inputted to the flash memory from a control apparatus such as an external CPU includes, for example, a reset signal RES, a chip selection signal CE, a write control signal WE, an output control signal OE, a command enable signal CDE indicating command or data input or address input and a system clock signal SC or the like. The command and address are respectively fetched with the control circuit 20 and address counter 32 depending on the command enable signal CDE and write control signal WE and the write data is fetched, upon input of the system clock SC, with the data control circuit 33 in synchronization with this clock when the command enable signal CDE indicates a command or a data input.

Figure 2:
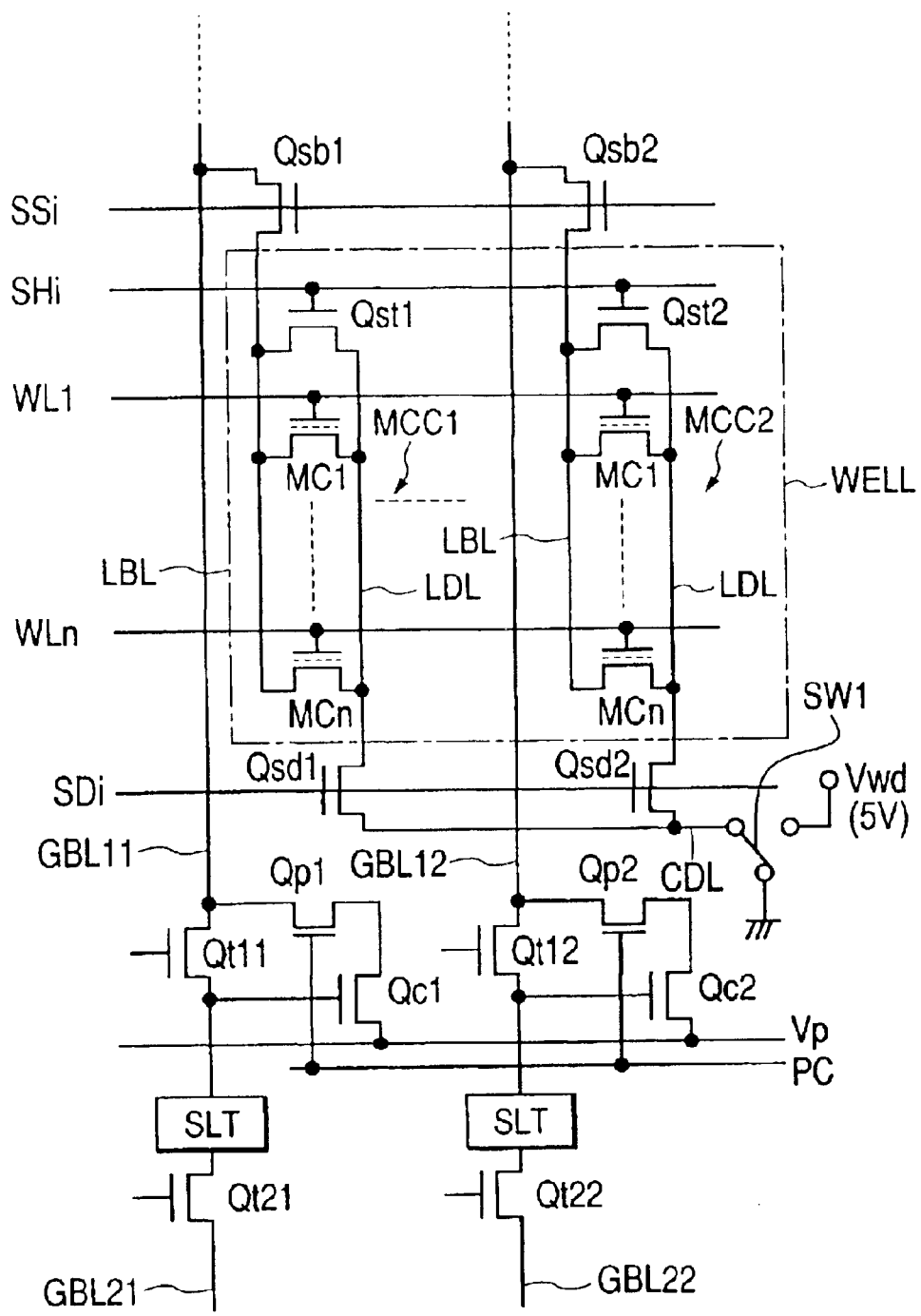
FIG. 2 is a structural diagram of a circuit configuration showing a preferred embodiment of memory array (so-called AND type) to which the present invention is adapted.

FIG. 2 shows a practical example of the memory array 10 (so-called the AND type) to which the present invention is suitably adapted. FIG. 2 shows a practical example of one memory mat in a memory array 10 of the embodiment structured with a couple of memory mats. As shown in this figure, in each memory mat, a plurality of memory columns MCC, consisting of n (for example, 256) memory cells (MOSFET including the floating gate) of the parallel mode MC1 to MCn which are arranged in the column direction and common connected in the source and drain, are allocated respectively in the row direction (word line WL direction) and the column direction (bit line BL direction). Although not particularly restricted, one word line is connected with about 16,000 memory cells.

There is provided a structure that one input/output node of the sense latch SLT is connected with the main bit lines GBL11, GBL12, . . . of one memory mat via the transmission MOSFET Qt11, Qt12, . . . , while the other input/output node of the sense latch SLt is connected with the main bit lines GBL21, GBL22, . . . of one memory mat via the transmission MOSFET Qt21, Qt22, . . . and thereby the read data is sensed with a potential difference of the main bit lines of both memory mats.

In each memory column MCC, the n memory cells MC1 to MCn and the source and drain of one short MOSFET Qst are respectively connected with the common local bit line LBL and common local drain line LDL. Here, the local bit line LBL can be connected with the main bit line GBL via the selected MOSFET Qsb, and the local drain line LDL with the common drain line CDL via the selected MOSFET Qsd. The memory array is divided into a plurality of blocks and the local bit line LBL provided for each block is connected to the main bit line GBL via the selected MOSFET Qsb. Thereby, the power consumption required for precharge of the local bit line LBL can be reduced.

The memory columns laid in the word line direction (called as one block) among a plurality of memory columns having the common local bit line LBL and local drain line LDL are formed within the same well region WELL on the semiconductor substrate. These memory columns give, during the data erasing operation, the potential such as 0V to the well region WELL and local drain line LDL and apply a negative voltage such as −16V to the word line using in common the well region. Thereby, simultaneous erase can be realized in unit of sector or block by pulling the negative load from the floating gate of the memory cells in the block by utilizing the FN tunnel phenomenon.

On the occasion of data erasing operation, a change-over switch SW1 is connected to the ground potential side through which the potential of 0V is applied to the drain of each memory cell via the common drain line CDL. In this case, the selected MOSFET Qsb in the bit line side is turned OFF, while the short MOSFET Qst is turned ON and the local bit line LBL is set to the potential such as 0V because the voltage in the source side is transferred through the short MOSFET Qst in the ON condition.

Figure 3:
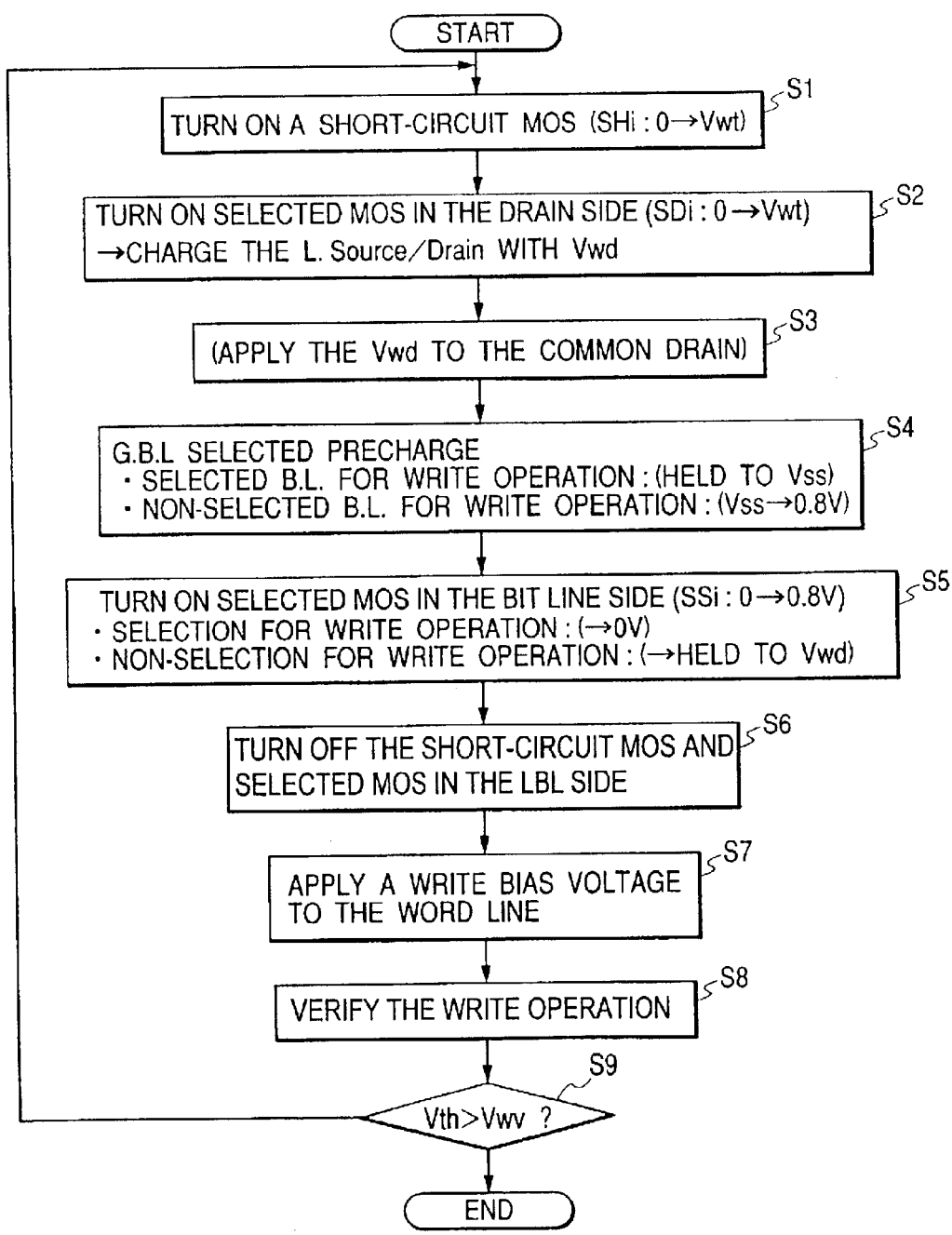
FIG. 3 is a flowchart showing the procedures of write operation in an AND type memory array of a preferred embodiment.
Figure 4:
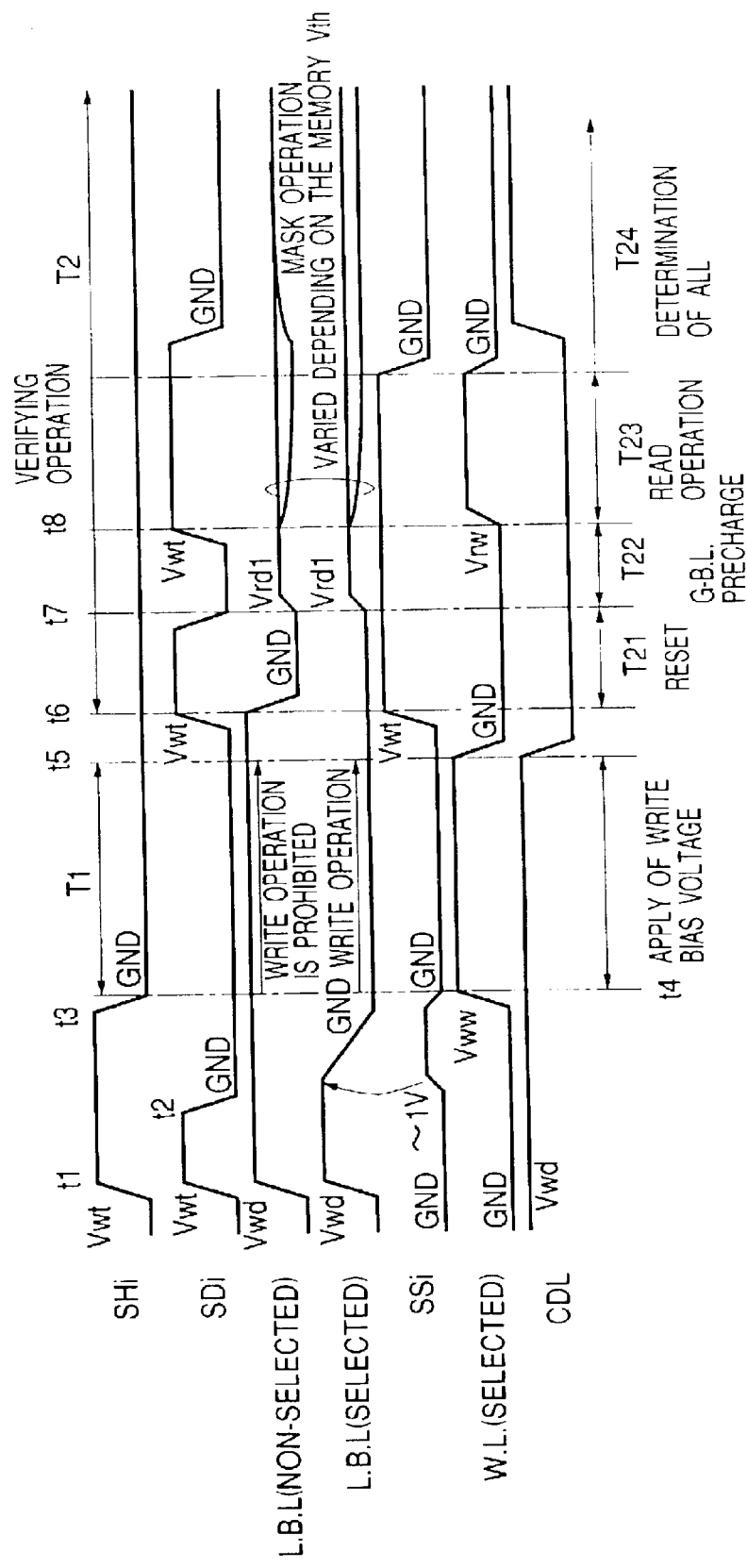
FIG. 4 is a timing chart showing operation timings of write operation in the AND type memory array of a preferred embodiment.

FIG. 3 shows the procedures of write operation in the AND type memory array of this embodiment and FIG. 4 shows the timing chart thereof.

As shown in FIG. 3, during the data write operation, a control signal SHi is first raised to the selection level such as 5V to turn ON the short MOSFET Qst (step S1, timing t1) under the condition that the selected MOSFET Qsb on the local bit line LBL is turned OFF. Subsequently, a control signal SDi is raised up to the selection level such as 5V to turn ON the selected MOSFET Qsd in the common drain side (step S2) under the condition that the change-over switch SW1 is connected to the drain charging voltage Vwd side. Thereby, the local drain line LDL and local bit line LBL are charged, for example, to the voltage Vwd such as 5V (step S3).

Next, the main bit line GBL is selectively precharged based on the write data held in the sense latch SLT (step S4). In particular, the main bit line GBL connected with the memory cells as the object of write operation is held at 0V and the main bit line GBL connected with the memory cells which are not the object of write operation is precharged to the voltage as low as 0.8V which is lower than the external power supply voltage Vcc.

Thereafter, the control signal SDi is set to 0V to turn OFF the selected MOSFET Qsd in the common drain side. Subsequently, the control signal SSi is raised up to the selection level such as 0.8V to turn ON the selected MOSFET Qsb in the local bit line (step S5, timing t2). Thereby, since the potential of the precharged main bit line GBL is 0.8V and the potential of the not-precharged main bit line GBL is 0V, the selected MOSFET Qsb connected to the not-precharged main bit line GBL is turned ON but the selected MOSFET Qsb connected to the precharged main bit line GBL is not turned ON because the gate and source thereof are in the same voltage level. Therefore, the local bit line corresponding to the precharged main bit line GBL holds the drain charging voltage Vwd, while the local bit line corresponding to the not-precharged main bit line GBL is discharged to 0V.

Next, the control signal SHi and control signal SSi are set to 0V to turn OFF the short MOSFET Qst and the selected MOSFET Qsb in the local bit line side (step S6, timing t3). Thereafter, the write voltage such as 1.4V is applied to the word line (step S7, timing t4) Thereby, since the non-selected local bit line holds the drain charging voltage Vwd, the field between the substrate and floating gate of the non-selected memory cells is alleviated and an FN tunnel current does not flow and thereby a threshold voltage of the memory cell does not change.

Meanwhile, since the selected local bit lines are discharged to 0V, negative charges are implanted to the floating gate with the FN tunnel current to conduct the write operation in which the threshold voltage of the memory cell is raised (period T1 in FIG. 4).

When the above write cycle is completed, a read operation to verify the write operation is conducted (step S8, period T2) to determine whether the threshold voltage Vth of memory cell becomes higher than the verification level Vwv or not (step S9). When the threshold voltage Vth is higher than the verification level Vwv, the write operation is completed and when the threshold voltage Vth is not higher than the verification level Vwv, the write cycle is conducted again after returning to the step S1.

The verification read operation sets, as shown in FIG. 4, the potential of the word line WL and common drain line CDL (timing t5) and thereafter raises the control signal SDi and control signal SSi to turn ON the selected MOSFETs Qsb and Qsd (timing t6) in view of discharging the local bit line LBL and local drain line LDL (period T21). Thereafter, the control signal SDi is set to turn OFF the selected MOSFET Qsb (timing t7) and the potential of the main bit line GBL is precharged up to about 0.8V with the sense latch SLT (period T22).

Subsequently, the control signal SDi is raised again to turn ON the selected MOSFET Qsb and to raise the word line WL (timing t8). A current flows into the memory cell depending on the threshold voltage of the memory cell connected to the selected word line to indicate whether the potential of the main bit line GBL has changed or not and this current is amplified with the sense latch SLT (period T23). Thereafter, the data held in the sense latch SLT is checked to conduct the all-determination to know whether all write operations are completed or not (period T24).

Figure 5:
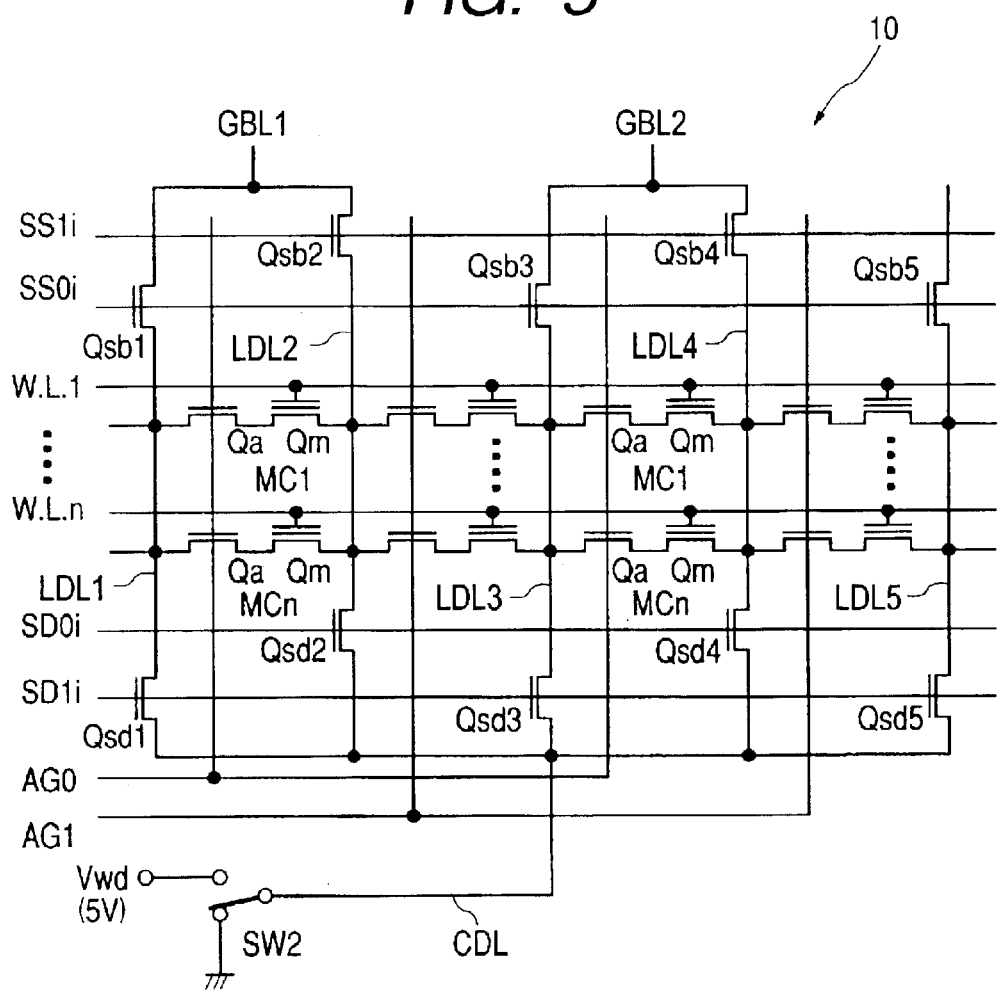
FIG. 5 is a circuit structure diagram showing the other practical example (so-called AG-AND type) of a memory array to which the present invention is adapted.

FIG. 5 shows another embodiment of the memory array 10 (so-called the AG-AND type) to which the present invention is preferably adapted. In this memory array of this embodiment, a memory cell MC is structured, as shown in FIG. 5, with a MOSFET Qm as a non-volatile memory element having the floating gate and an assisting gate MOSFET Qa in which the channel thereof is connected series with the channel of the memory element Qm.

A plurality of memory columns MCC in the parallel configuration, in which the n (for example, 256) memory cells MC1 to MCn of the structure explained above are allocated in the column direction and the sources or drains of the memory elements Qm and the drain or source of the assisting gate MOSFET Qa are connected in common, are allocated respectively in the row direction (word line WL direction) and column direction (bit line GBL direcion) to form a memory array.

Structure is executed under the structure that the gates of the memory elements Qm of the memory cells in the same row form the word line WL or are connected to the word line and the common control signal AG0 is applied to the gate of the assisting gate MOSFET Qa of the odd numbers memory columns, while the common control signal AG1 is applied to the gate of the assisting gate MOSFET Qa of the even numbers memory columns.

In addition, in the memory array of this embodiment, the local drain line LDL which is used in common as the local bit line and local drain line (or local source line) is placed in the direction crossing the word line. Therefore, one local drain line LDL is connected with the source or drain of the memory element Qm of the memory cells MCi located in both sides of above one drain line and with the drain or source of the assisting gate MOSFET Qa of MCCi+1.

One end of each local drain line LDL can be connected respectively with the common bit lines GBL1, GBL2, . . . in every two lines via the selected MOSFETs Qsb1, Qsb2, . . . , and the other end with the common drain (or common source line) CDL via the selected MOSFETs Qsd1, Qsd2 . . . . Moreover, the selected MOSFET Qsb on the odd numbers local drain lines LDL and the selected MOSFET Qsb on the even numbers local drain lines LDL among the selected MOSFETs Qsb1, Qsb2 . . . enabling connection of the local drain line LDL to the corresponding main bit line GBL are controlled to turn ON and OFF with different control signals SS0i and SS1i.

On the other hand, the selected MOSFET Qsd on the odd numbers local drain lines LDL and the selected MOSFET Qsd on the even numbers local drain lines LDL among the selected MOSFETs Qsd1, Qsd2 . . . enabling connection of the local drain line LDL to the common drain line CDL are controlled to turn ON and OFF with different control signals SD0i and SD1i which do not become high level simultaneously. Moreover, when attention is paid to a certain local drain line LDL, the control signals SS0i, SS1i and SD0i, SD1i are formed not to turn ON simultaneously the selected MOSFET Qsb in the main bit line side and the selected MOSFET Qsd in the common drain line CDL side.

The voltage Vss (0V) or the write voltage Vwd such as 5V is impressed to the common drain line CDL via the change-over switch SW2. Although not shown in FIG. 5, the main bit line GBL connected with the adjacent two local drain lines LDL via the selected MOSFET Qsb is extended in the direction crossing the word line WL and one end thereof is connected to the sense latch SLT, while the other end thereof to the data latch DLT.

Here, the principle of the data write operation in the AG-AND type memory array of this embodiment will be explained with reference to FIG. 6. Write operation to the memory array in this embodiment is performed in the manner that the write operation to the memory cells in the odd numbers columns and the write operation to the memory cells in the even-number columns are individually executed on the time division basis.

Figure 6A:
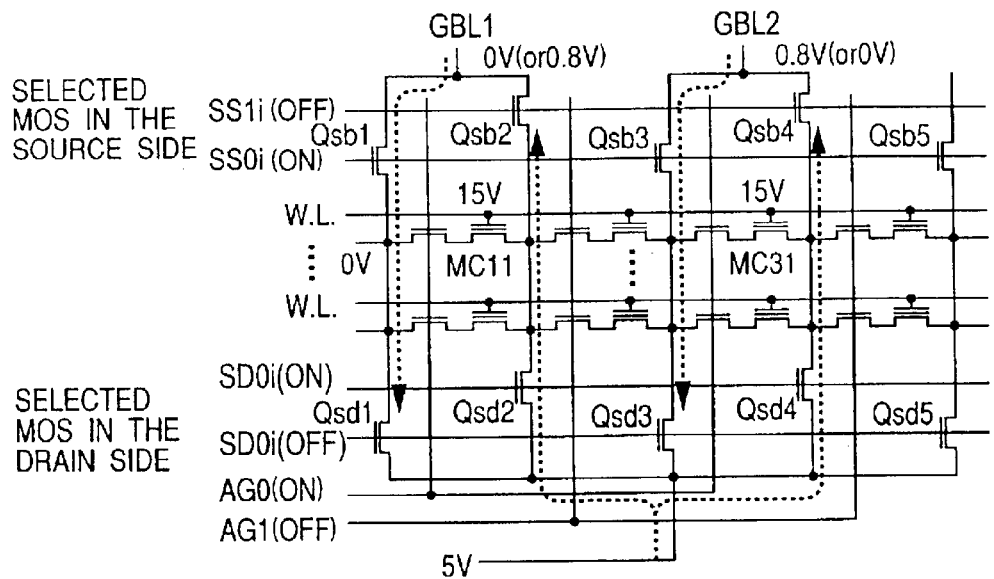
FIGS. 6(A) and 6(B) are diagrams for explaining a circuit to show a way of supply a voltage during the write operation in the AG-AND type memory array to which the present invention is adapted.

During the data write operation to the memory cells of the odd-number columns, the voltage Vwd such as 5V is applied to the local drain lines LDL2, LDL4 of the even numbers, as shown in FIG. 6(A), under the conditions that the selected MOSFETs Qsb1, Qsb3, . . . in the side of the main bit lines of the odd-number columns are turned ON, while the selected MOSFETs Qsd1, Qsd3 . . . in the common drain line CDL side are turned OFF and moreover the selected MOSFETs Qsb2, Qsb4 . . . in the main bit lines of the even-number columns are turned OFF, while the selected MOSFETs Qsd2, Qsd4 . . . in the common drain line CDL side are turned ON.

In addition, a voltage of the main bit line is transferred to the local drain lines LDL1, LDL3, . . . of odd numbers via the selected MOSFETs Qsb1, Qsb3 . . . of the odd-number columns in the ON state by respectively applying 0V, from the main bit line GBL, to the main bit line connected with the memory cells (selected memory cells) of which threshold voltage must be changed depending on the write data and also applying 0.8V to the main bit line connected with the memory cells (selected memory cells) of which threshold voltage must not be changed. Moreover, in this case, the assisting gate MOSFET Qa of the memory cells of the odd-number columns is turned ON by raising the control signal AGO to the voltage such as 0.6V and also raising the word line to a voltage as high as 15V of the write selection level.

Figure 7A:
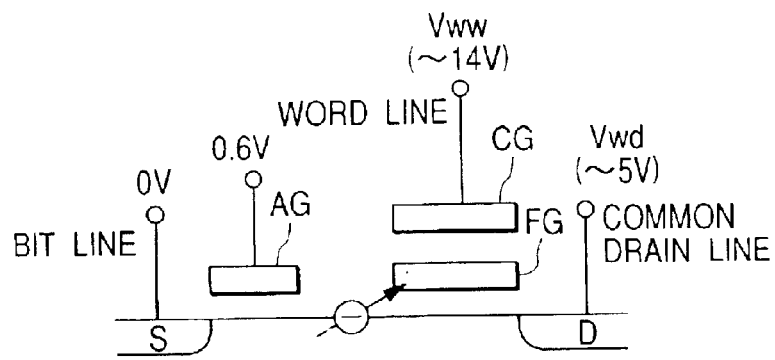
FIGS. 7(A), 7(B) and 7(C) are diagrams for explaining a cross-section of the AG-AND type memory array to which the present invention is adapted showing the bias condition of the selected memory cells and non-selected memory cells during the write operation and the bias condition during the erase operation.

Thereby, the voltage 0V is supplied to the memory elements Qm of the selected memory cells (for example, MC11) from the local drain lines LDL1, LDL3, . . . of the odd numbers, and the voltage 5V from the local drain lines LDL2, LDL4, . . . of the even numbers. Therefore, the voltages as shown in FIG. 7(A) are applied to the control gate CG, assisting gate AG and source S, drain D of the selected memory cell (MC11) and thereby the hot electrons generated when a drain current flows toward the common drain line side from the bit line side are implanted to the floating gate FG to change the threshold voltage.

Figure 7B:
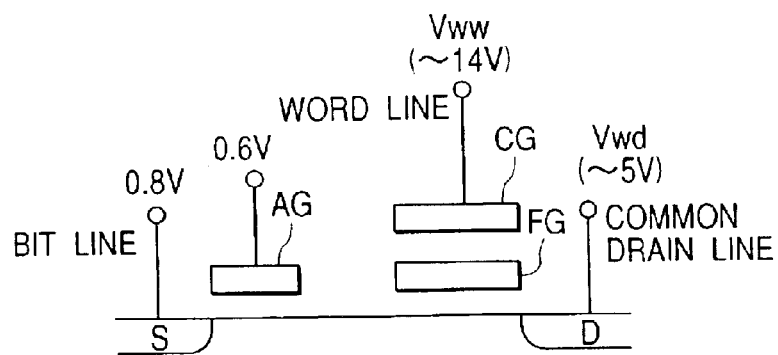

Meanwhile, the voltage 0.8V is supplied to the source of the memory element Qm of the non-selected memory cells (for example, MC31) from the local drain lines LDL1, LDL3, . . . of the odd numbers, and the voltage 5V to the drain from the local drain lines LDL2, LDL4, . . . of the even numbers, the voltages as shown in FIG. 7(B) are applied to the control gate CG, assisting gate AG and source S and drain D of the non-selected memory cell (MC31) and therefore a drain current does not flow and the threshold voltage does not change.

Figure 6B:
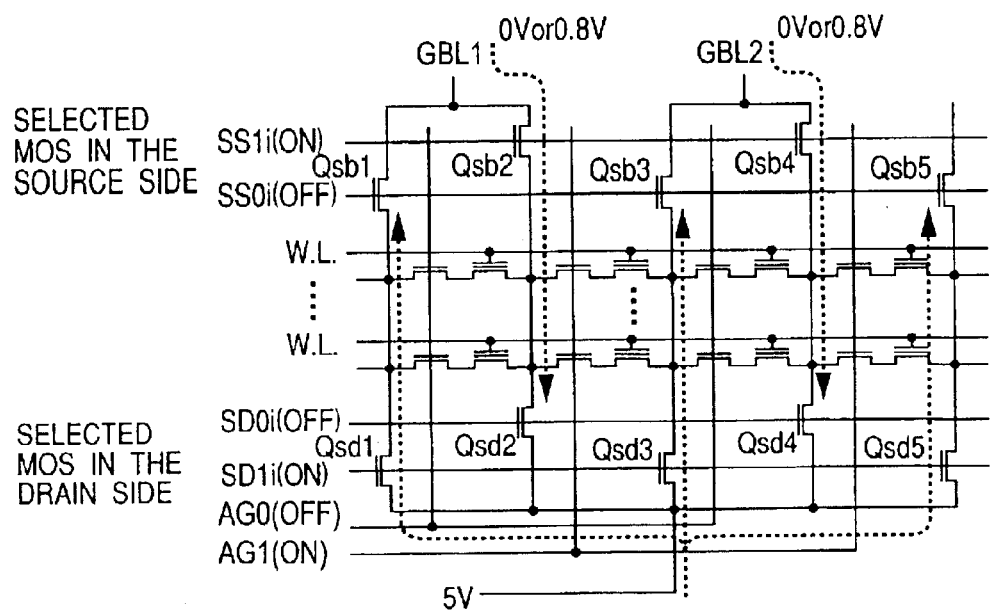

During the data write operation to the memory cells of the even-number columns, a voltage such as 5V is impressed to the local drain lines LDL1, LDL3, . . . of the odd numbers from the common drain line CDL as shown in FIG. 6(B) under the conditions that the selected MOSFETs Qsb2, Qsb4, . . . in the main bit line side of the even numbers are turned ON, the selected MOSFETs Qsd2, Qsd4, . . . in the common drain line CDL side are turned OFF, the selected MOSFETs Qsb1, Qsb3, . . . in the main bit line side of the odd numbers are turned OFF and the selected MOSFETs Qsd1, Qsd3, . . . in the common drain line CDL side are turned ON. Thereafter, with the operation similar to the data write operation to the memory cells of the odd-number columns, the threshold voltage of the selected memory cells can be varied and the threshold voltage of the non-selected memory cells is kept unchanged.

As explained above, in the AG-AND type memory array of this embodiment, it is only required to precharge, up to 0.8V, the main bit line GBL having considerably larger parasitic capacitance than that of the common drain line CDL and the local drain line LDL connected thereto depending on the write data. Thereby, the time required to raise the voltage of bit line can be shortened and the power consumption can also be reduced remarkably.

Moreover, in the AG-AND type memory array, high integration density can also be attained because the adjacent memory elements Qm can be electrically isolated with the assisting gate MOSFET Qa and an isolation region provided to electrically isolate the adjacent memory elements is no longer required in the ordinary AND type memory array. In practice, the memory cells in the AG-AND type memory array can be implemented using the structure shown in FIG. 15.

Figure 15:
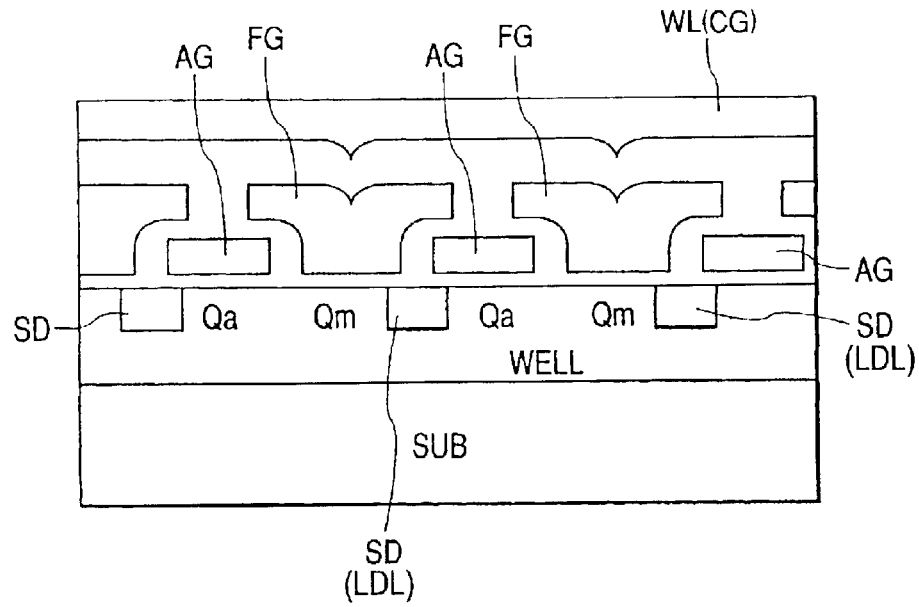
FIG. 15 is a cross-sectional view showing an example of practical structure of the AG-AND type memory array to which the present invention is applied.
Figure 16A:
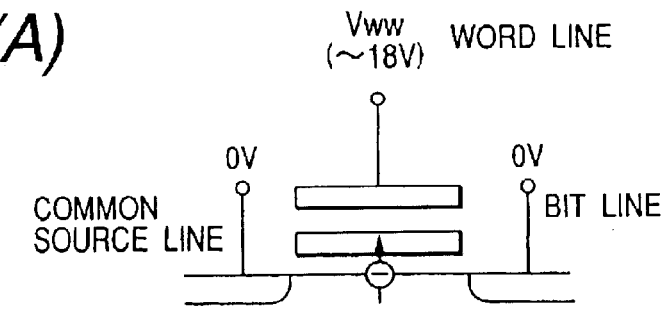
FIGS. 16(A) and 16(B) are explanatory diagrams of cross-section showing examples of the voltage applied to the memory cells in the existing write system using the FN tunnel.
Figure 16B:
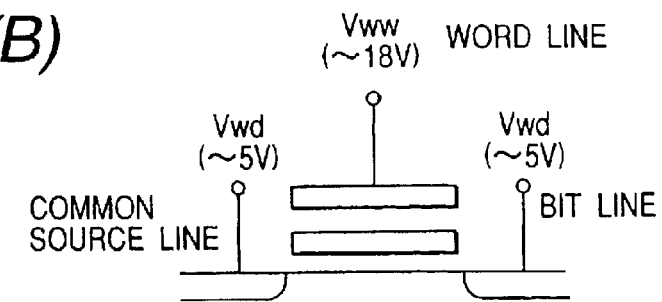

In FIG. 15, SUB designates a semiconductor substrate; WELL, a well region and SD, a diffusion region as the source drain of the assisting gate MOSFET Qa and memory element Qm and is also used as the local drain line LDL in this embodiment. Moreover, AG is a gate electrode of the assisting gate MOSFET Qa; FG, a floating gate electrode of the memory element Qm and WL, a word line and also a control gate electrode of the memory element Qm. From FIG. 15, in the AG-AND memory array, when the assisting gate AG is set to 0V to turn OFF the MOSFET Qa, the control gate (WL) is set to a high level and a current flowing into the memory element Qm can be cut off even if there is a voltage difference between the source and drain SD. Therefore, it can be understood that the isolation region between memory elements is no longer required and high integration density can be attained. The well region WELL and gate electrode AG, FG and word line WL can respectively be insulated with the insulation films.

Figure 8:
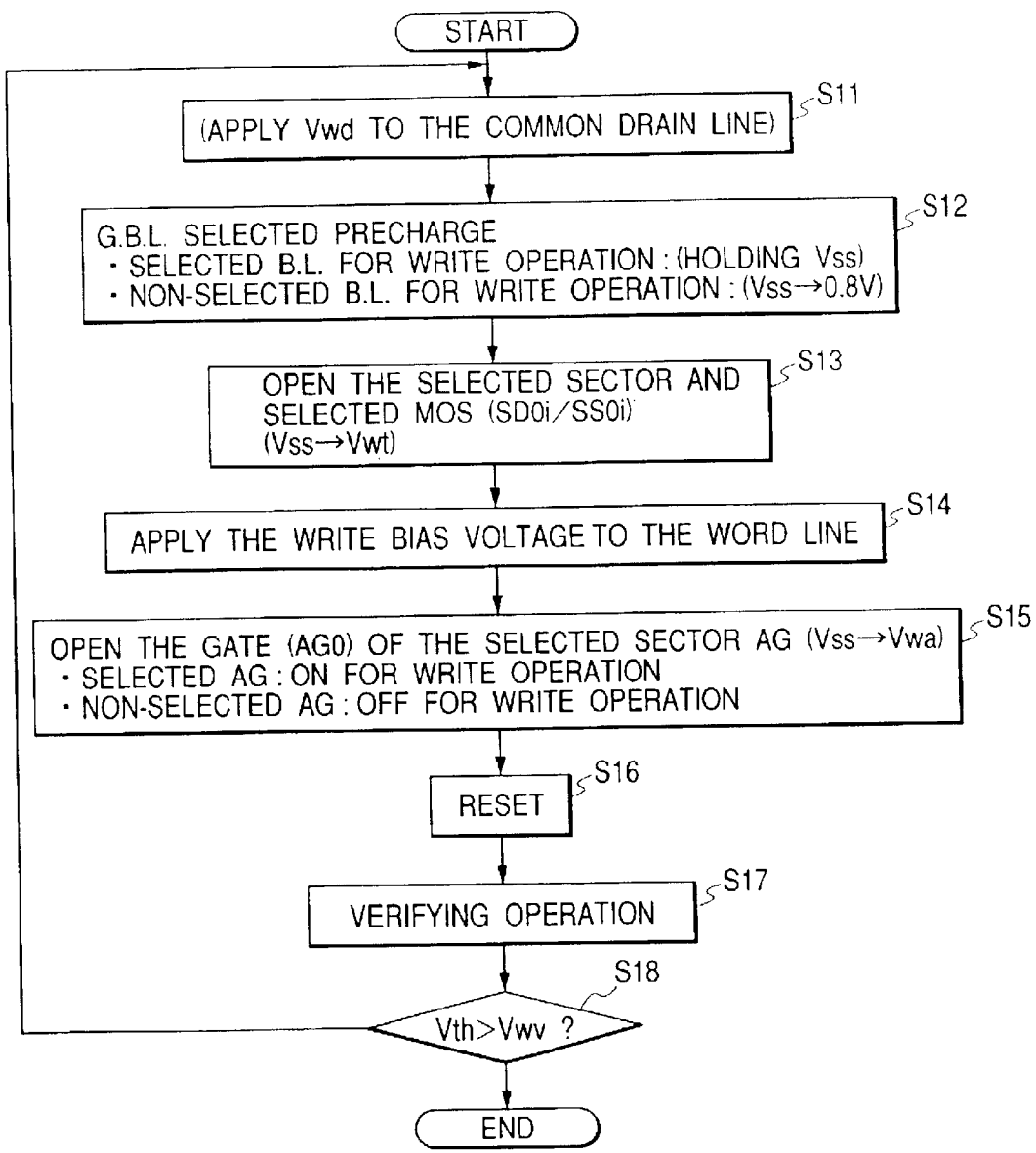
FIG. 8 is a flowchart showing the write operation procedure in the AG-AND type memory array to which the present invention is adapted.
Figure 9:
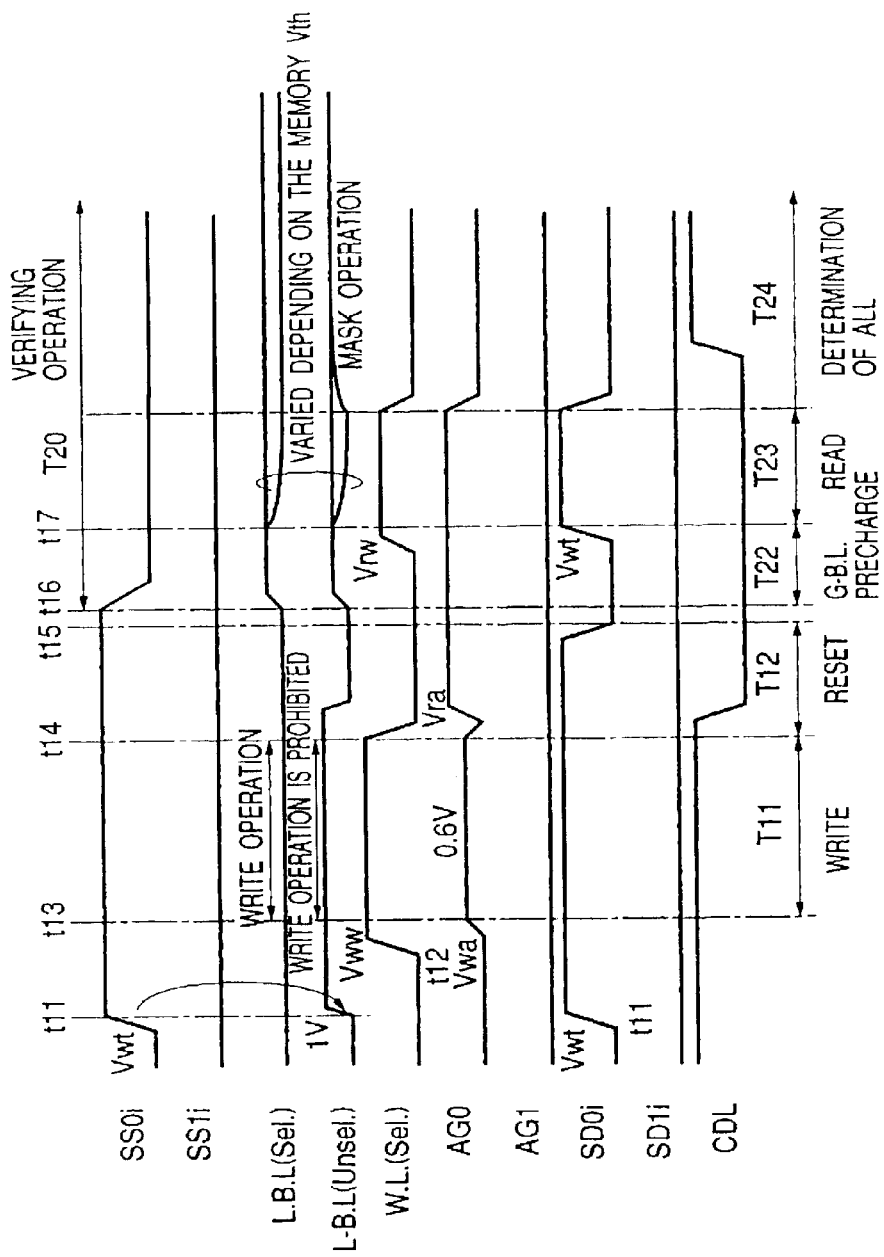
FIG. 9 is a timing chart showing the write operation timings in the AG-AND type memory array to which the present invention is adapted.

FIG. 8 shows the procedures of write operation in the AG-AND type memory array of this embodiment and FIG. 9 shows the timing chart of this write operation. An example of the data write operation to the memory cells of the odd-number columns will be explained.

For the data write operation to the memory cells of the odd-number columns, a drain charge voltage Vwd is impressed to the common drain line CDL under the condition that the selected MOSFETs Qsb, Qsd on the local bit line LBL are all turned OFF (step S11). Subsequently, the main bit line GBL is selectively precharged depending on the write data held in the sense latch SLT (step S12). More particularly, the main bit line GBL connected with the memory cells as the write operation object holds 0V and the main bit line GBL connected with the memory cells which are not the write operation object is precharged to the voltage of 0.8V.

Next, the control signals SS0$i$ and SD0$i$ are set to the selection level such as 7V to turn ON the selected MOSFET Qsb on the local bit lines LBL of odd-numbers and the selected MOSFET Qsd on the local bit lines LBL of even numbers. Thereby, the local drain lines LDL of even numbers are charged to Vwd and the local drain lines LDL of odd numbers are charged selectively to 0.8V depending on the write data.

Thereafter, the write voltage as high as 14V is impressed to the word line (step S4, timing t12). Moreover, the control signal AGO for controlling the assisting gate corresponding to the memory cells of odd numbers as the write operation object is raised up to the voltage of 0.6V (step S5, timing t13). Thereby, since the potential of the non-selected local drain lines LDL connected to the precharged bit lines GBL is 0.8V and the potential of the selected local drain lines LDL connected to the main bit line not pre-charged is 0V, the assisting gate MOSEET Qa of the memory cell connected to the local drain line LDL of 0.8V is not turned ON but the assisting gate MOSFET Qa of the memory cell connected to the local drain line LDL of 0V is turned ON.

Therefore, a current does not flow into the channel of the memory element Qm of the memory cell of the assisting gate MOSFET Qa not turned ON and thereby the threshold voltage of the memory cell is not changed. On the other hand, a current flows into the Qa side in the channel of the memory element Qm of the memory cell of the assisting gate MOSFET Qa to be turned ON to realize the write operation in which the hot electrons generated are implanted to the floating gate to raise the threshold voltage of the memory cell (period T11).

Upon completion of the write operation, the potential of the selected word line WL is fallen to 0V from the selection level and the control signal AGO for controlling the assisting gate and the potential of the common drain line CDL are also fallen to 0V to reset the local drain line LDL (step S16, period T12) Thereafter, the verification operation (step S17, period T20) is conducted to determine whether the threshold voltage Vth of the memory cell becomes higher than the verification level Vwv (for example, 4V) or not (step S18). When the threshold voltage Vth becomes higher than the verification level Vwv, the write operation is completed and when the threshold voltage Vth does not become higher than the verification level Vwv, the write operation is conducted again after returning to the step S11.

In the read operation for verification explained above, as shown in FIG. 9, the control signals SS0i and SD0i are fallen to turn OFF the selected MOSFET Qsd on the local bit lines LBL of even numbers and thereafter to precharge the potential of the main bit line GBL to about 0.8V with the sense latch under the condition that the control signal AG0 is raised up to 2V which is higher than 0.6V during the write operation to sufficiently turn ON the assisting gate MOSFET Qa (timing t16, period T22).

Subsequently, the control signal SD0i is raised to turn ON the selected MOSFET Qsd on the local bit lines LBL of even numbers and the word line WL is then raised (timing t17). A current flows into the memory cells depending on the threshold voltage of memory cells connected to the selected word line and the signal indicating whether the potential of the main bit line GBL has changed or not is amplified with the sense latch (period T23). Thereafter, the data held in the sense latch is checked to conduct the all-detemination to detect whether all write operations have been completed or not (period T24).

Next, the principle of the data read operation in the AG-AND type memory array of this embodiment will be explained with reference to FIG. 10. In this read operation of the memory array in this embodiment, the read operation of memory cells of the odd-number columns and that of the memory cells of the even-number columns are individually conducted on the time division basis. However, the timing of each read operation is similar to that in the read operation for verification shown in FIG. 9.

Figure 10A:
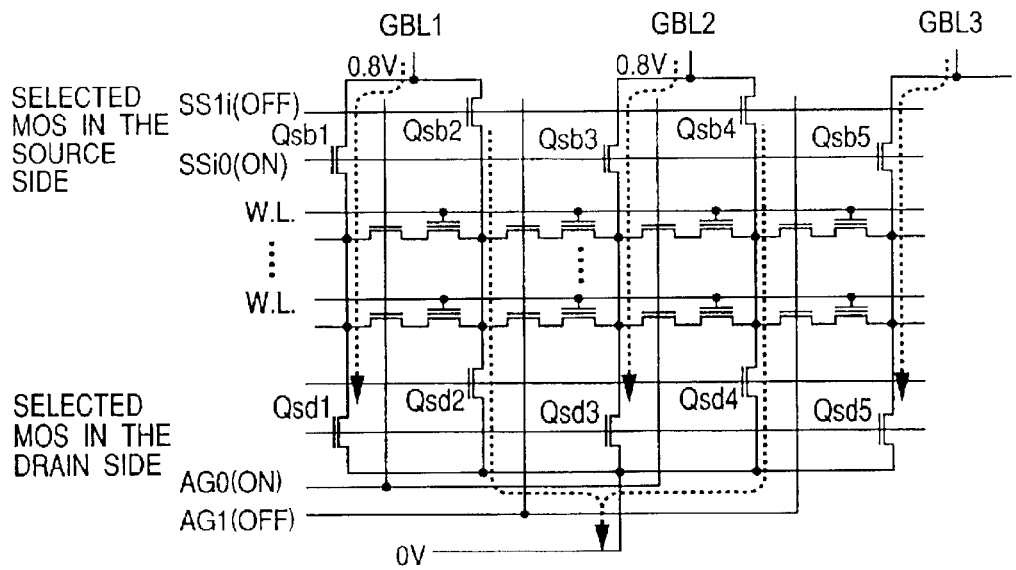
FIGS. 10(A) and 10(B) are explanatory diagrams of a circuit to show a way of supplying a voltage during the read operation in the AG-AND type memory array to which the present invention is adapted.

As shown in FIG. 10(A), for the data read operation from the memory cells of the odd-number columns, a voltage such as 0V is impressed to the local drain lines LDL 2, LDL4, . . . from the common drain line CDL under the condition that the selected MOSFETs Qsb2, Qsb4, . . . in the side of the main bit lines of even numbers are turned OFF, the selected MOSFETs Qsd2, Qsd4, . . . in the side of the common drain line CDL are turned ON, the selected MOS-FETs Qsb1, Qsb3, Qsb5, . . . in the side of the main bit lines of odd numbers are turned ON and the selected MOSFETs Qsd1, Qsd3, Qsd5, . . . in the side of the common drain line CDL are turned OFF.

Moreover, the main bit lines are respectively precharged, for example, up to the potential such as 0.8V to transfer the voltage of the main bit lines to the local drain lines LDL1, LDL 3, . . . of odd numbers from the main bit lines GBL via the selected MOSFETs Qsb1, Qsb3, Qsb5, . . . of odd numbers in the ON state. Moreover, in this timing, the control signal AGO is raised to turn ON the assisting gate MOSFET Qa of the memory cells of odd numbers and also to raise the word line up to the read and selection level voltage (in the case of binary level, up to 4V for example and in the case of multi-level, up to 1.3V, 2.6V, 4.0V or the like for example).

Thereby, since the voltage of 0.8V is supplied, to the memory element Qm of the selected memory cell (for example, MC11) from the local drain lines LDL1, LDL3, . . . of odd numbers and the voltage of 0V from the local drain lines LDL2, LDL4, . . . of even numbers, a drain current sometimes flows or does not flow depending on the threshold voltage of the memory element Qm. Therefore, when the drain current flows, the potential of main bit line GBL changes to 0V and when the drain current does not flow, the main bit line GBL holds the potential of 0.8V. The potential of this main bit line GBL is detected with the sense latch to obtain the read data.

Figure 10B:
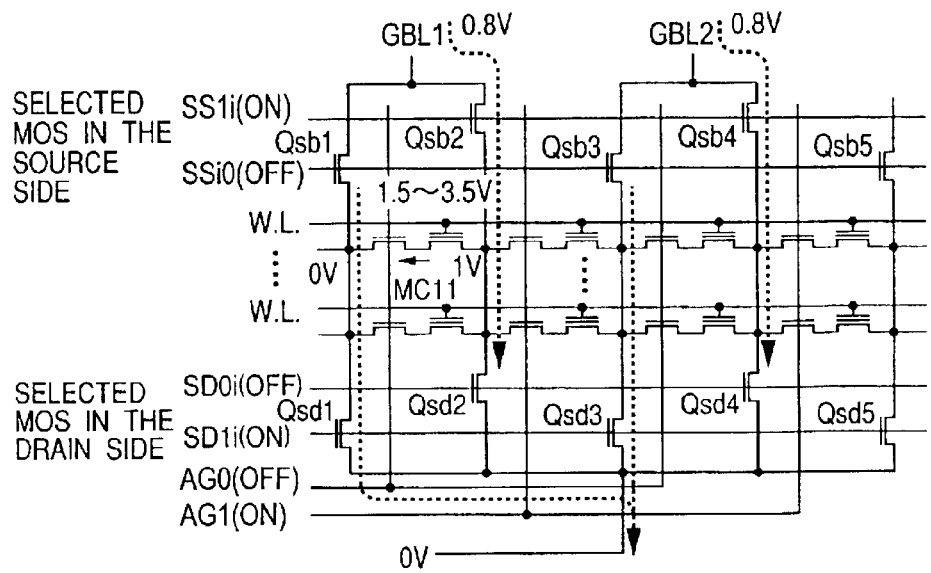

As shown in FIG. 10(B), for the data read operation from the memory cells of the even-number columns, the voltage such as 0V is impressed to the local drain lines LDL1, LDL3, . . . of odd numbers from the common drain line CDL under the condition that the selected MOSFETs Qsb2, Qsb4, . . . in the side of the main bit lines of the even-number columns are turned ON, the selected MOSFETs Qsd2, Qsd4, . . . in the side of the common drain line CDL are turned OFF, the selected MOSFETs Qsb1, Qsb3, . . . in the side of the main bit lines of the odd-number columns are turned OFF and the selected MOSFETs Qsd1, Qsd3, . . . in the side of the common drain line CDL are turned ON.

Moreover, the main bit lines transfer the potential thereof to the local drain lines LDL2, LDL4, . . . of even numbers via the selected MOSFET Qsb2, Qsb4, . . . of the even-number columns which are respectively precharged to 0.8V to turn ON. Moreover, in this timing, the control signal AG1 is raised to turn ON the assisting gate MOSFET Qa of the memory cells of the even-number columns and the word line is also raised up to the read and selection level such as the voltages of 1.3V, 2.6V and 4.0V. Thereby, the data can be read from the memory cells of the even-number columns connected to the selected word line.

Figure 7C:
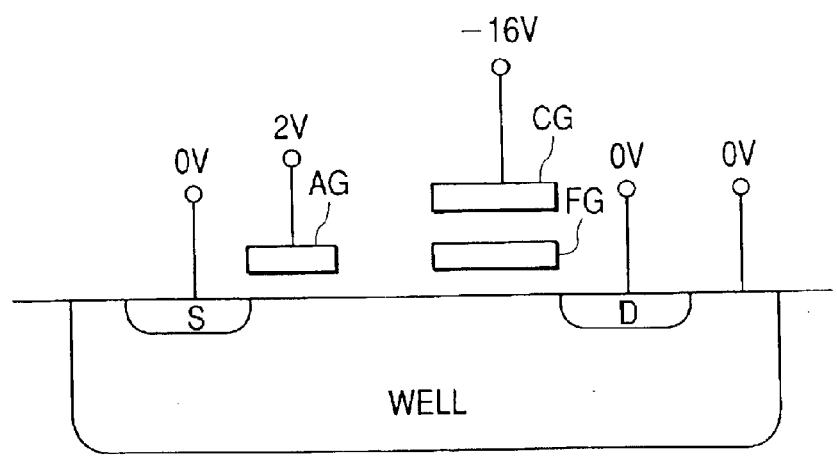

In the AG-AND type memory array of this embodiment, data can be erased, as shown in FIG. 7(C), by impressing a negative voltage such as −16V to the control gate CG of memory cell, a positive voltage such as 2V to the assisting gate AG and 0V to the source S, drain D and well WELL to extract the negative charge from the floating gate FG to the substrate side with the FN tunnel phenomenon. Moreover, erasure of data is conducted at a time to all memory cells connected to the same word line without relation to the odd number columns and even number columns.

Figure 11:
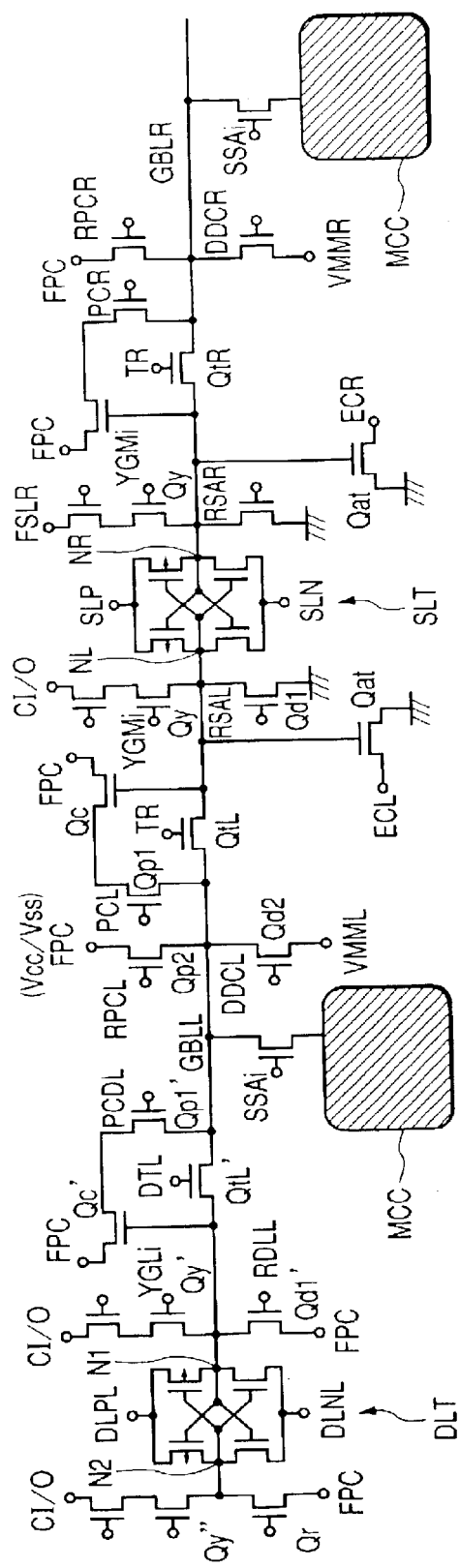
FIG. 11 is a circuit structure diagram showing a practical example of peripheral circuits of the AG-AND type memory array to which the present invention is adapted.

FIG. 11 shows a practical example of the circuit including the sense latch SLt and data latch DLT in the periphery of array for enabling the write operation, read operation and erasing operation in the AG-AND type memory array of this embodiment. In the FIG. 11, a circuit in relation to one main bit line is shown in the condition that the memory cells are omitted and the hatched portion is the memory cell column MCC.

As shown in FIG. 11, the sense latch SLT and data latch DLT connected to the main bit line GBL are formed of a flip-flop circuit in which the input/output terminals of two CMOS inverters consisting of the P-channel MOSFET and N-channel MOSFET. The main bit line GBL in one memory mat is connected to one input/output node NL of the sense latch SLT via the transfer MOSFET QtL. Moreover, the main bit line GBL in the other memory mat is connected to the other input/output node NR of the flip-flop FF via the transfer MOSFET QtR. Since the circuit is symmetrical in both sides of the sense latch SLT, only the structure in the main bit line GBL side will be explained.

The MOSFET Qd1 for sense latch reset is connected to the input/output terminal NL in the left side of the sense latch SLT. Moreover, the MOSFETs Qp1, Qp2 for precharge and the MOSFET Qd2 for discharge are connected to each main bit line GBL L. Qp1 of these MOSFETs is connected to the terminal to which the power supply FPC is supplied via the MOSFET Qc, the gate of Qc is connected to the input/output node NL of the sense latch SLT and is then turned ON and OFF depending on the data being held and PCL is set to the potential identical to 0.8V+Vth (threshold voltage). Thereby, when the data held in the sense latch SLT is "1", the corresponding main bit line GBL is precharged to 0.8V.

The precharge MOSFET Qp2 sets the main bit line GBL L to 0.8V when the gate control signal RPCL is identical to the potential of 0.8V+Vth and also precharges the main bit line GBL R to 0.4V when the signal RPCL is identical to the potential of 0.4V +Vth in the memory mat of the opposite side. Moreover, the precharge MOSFET Qp2 is also used for discharging the main bit line GBL. On the other hand, the discharge MOSFET Qd2 is used to discharge the main bit line GBL and applies, at the time of erasing operation, the potential (0V) which is identical to the potential of the well region. As explained above, voltage falling rate is improved to realize quick transfer to the next operation by extracting the changes of the main bit line having larger capacitance using both MOSFETS Qp2 and Qd2.

In addition, the input/output terminal NL of the sense latch SLT can be connected with the common input/output line CI/O with the other end thereof connected to the main amplifier 15a via the column switch MOSFET (Y gate) Qy. Moreover, since the input/output node NL of the sense latch SLT is connected with the gate of the MOSFET Qat for all-"0" determination and the corresponding MOSFET Qat turns ON to allow a current to flow when the data held in the sense latch SLT is "1", whether the data held in all sense latches SLT is "0" or not can be determined by detecting such current. The drains ECL (ECR) of the determination MOSFET Qat of each main bit line GBL L (GBL R) are connected in common and are then connected to the "all" determination circuit 35. Although not shown, the elements Qp1, Qp2, Qd1, Qd2, Qc, Qy, Qat similar to those in the left side are connected to the input/output node in the right side of the sense latch SLT and also to the main bit line GBL R.

The MOSFETs QtL', Qp1', Qd1', Qc', Qy' which operate in the same manner as explained above are also connected between the other end of the main bit line GBL and one input/output node N1 of the data latch DLT. Moreover, the other input/output node N2 of the data latch DLT is connected, to determine the potential of the main bit line GBL L, with the element Qr for supplying the reference voltage 0.4V which is only a half of the precharge level (0.8V) and the Y gate MOSFET Qy" for outputting the latch data of data latch DLT to the main amplifier via the common I/O line CI/O. Although not shown, the other end of the main bit line GBL R in the opposite side is also connected with the elements operating in the same manner as the MOSFETs QtL', Qp1', Qd1', Qc', Qy', Qr' Qy" explained above and the data latch.

Figures 12A, 12B:
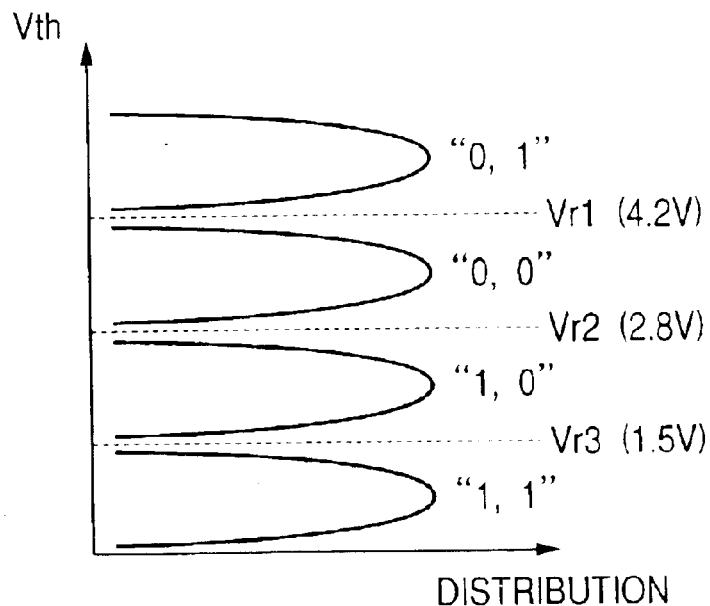
FIGS. 12(A) and 12(B) are explanatory diagrams showing distribution of threshold voltages of memory element during the multi-level data write operation in the AG-AND type memory array to which the present invention is adapted and a way of setting the data to the sense latch and data latch.

Next, in the memory array of this embodiment, operation for storing 4-level data in only one memory cell will then be explained. In the case of storing the 4-level data to only one memory cell, data is written in the manner that the threshold voltage of each memory element is included in any one of four distributions, for example, as shown in FIG. 12(A) based on the 2-bit data.

In more practical, in this embodiment, the write operations are respectively conducted to provide the largest threshold voltage when the 2-bit data is "0, 1", to provide the second largest threshold voltage when the data is "0, 0", to provide third largest threshold voltage when the data is "1, 0" and to provide the lowest threshold voltage when the data is "1, 1". In this embodiment, the condition where the threshold voltage corresponding to the stored data "1, 1" is lowest is defined as the erase condition where the negative charges are extracted from the floating gate of the memory element.

Figure 13:
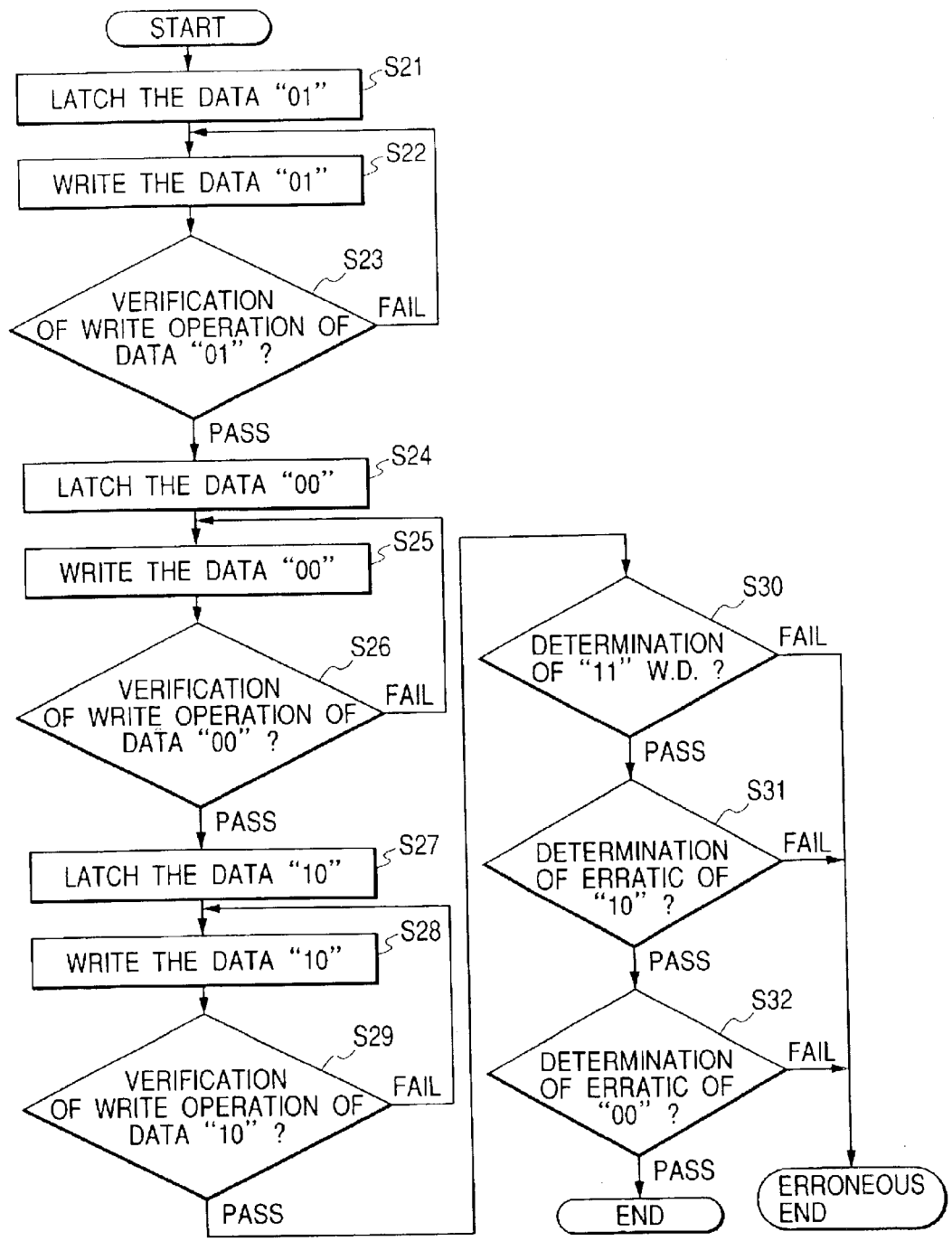
FIG. 13 is a flowchart showing the multi-level data write operation procedure in the AG-AND type memory array to which the present invention is adapted.

FIG. 13 shows the multi-level data writing procedures in the flash memory of this embodiment. All memory cells in the memory array is set to the erase condition where the threshold voltage becomes lowest before the write operation is started.

As shown in FIG. 13, the write operation is initiated from the process (step S21) to latch the data corresponding to the data "0, 1" where the threshold voltage becomes highest to a pair of the sense latch SLT and data latch DLT. In more practical, on the occasion of writing the data "0, 1", this data is transferred from the main amplifier, as shown in the first column of FIG. 12(B), to set the node NL in the side of memory array re-mat MATu of the sense latch SLT to high level (3.3V), the node in the bit line side of the data latch DLTu in the side of the memory array re-mat MATu to low level (0V) and to set the node in the bit line side of the data latch DLTd in the side of the memory array re-mat MATd to high level (3.3V). In FIG. 12(B), the code "H" indicates the high level (3.3V) and "L" indicates the low level (0V). Such data can be generated by converting, for example, the externally inputted 2-bit data with a data control circuit 33. Or, it is also possible to set the data as shown in FIG. 12(B) by once sending one of the 2-bit data to the data latch or sense latch to execute the inverting process or logical arithmetic process on the bit lines.

Here, it is also possible to form the structure that the transfer of 2-bit write data is conducted only to a pair of data latches DLT and is then transferred to the sense latch via the bit line GBL from the data latch. Moreover, at the time of reading the data, the read data detected with the sense latch SLT is transferred to the bit line GBL to the data latch DLT in the side of the selected memory mat, this read data is then amplified up to the signal of the amplitude of 3.3V with the data latch and is then sequentially transferred to the main amplifier from the data latch via the common I/O line.

When the write data is latched with a pair of the sense latch SLT and a data latch DLT and the write process (step S22) is executed based on such data. This write operation is conducted by impressing the write voltage to the memory cells connected to the bit line in which the input/output node in the side of the selected mat of the sense latch is set to the "H" level. Therefore, the write process to the half of the memory cells (odd-number columns or even-number columns) connected to one word line can be conducted simultaneously by conducting such write operation to all sense latches SLT and data latches DLT provided corresponding to all bit lines in the memory array.

When the write operation is completed once, the read operation is then executed for verification and the write determination for end of operation is conducted (step S23) when the "all" determination circuit determines whether the data of all sense latches have become "1" or not. When the write operation is not yet completed, the write process is executed again after returning to the step S22.

The write operation, in this case, is aided to the memory cells in which the threshold voltage has not been changed sufficiently in the first write process. In the verification process after the write operation, since the low level is read and held in the node of the selected mat side of the sense latch corresponding to the memory cells of which threshold voltages have not been changed with the write process and the high level is read and held in the node of the selected mat side of the sense latch corresponding to the memory cells which do not require the write process and of which threshold voltages have been changed sufficiently with the write process, it can be avoided that the write voltage is supplied again to the memory cells in which the write operations are already completed and thereby the threshold voltages are further changed, by selectively precharging all bit lines to conduct again the write process using the data, (the node in the selected mat side is set to the high level condition) still left in the sense latch with the verification process.

When the write operation of data "0, 1" is completed, the latch and write operations of the data "0,0" and the verification (steps S24 to S26) are conducted. For the write process of the data "0, 0", as shown in the second column of FIG. 12(B), the data is transferred from the main amplifier to result in the conditions that the node NL in the side of the memory array re-mat MATu of the sense latch SLT is set to the low level (0V), the node N1 in the side of the bit line of the data latch DLTu in the memory array re-mat MATu side is set to the high level (0.8V) and the node in the side of bit line of the data latch DLTd in the memory array re-mat MATd side is set to the high level (0.8V).

When the write process of the data "0, 0" is completed, the latch and write process of the data "1, 0" and the verification (steps S27 to S9) are then conducted. For the write process of the data "1, 0", as shown in the third column of FIG. 12(B), the data is transferred from the main amplifier to result in the conditions that the node NL in the side of the memory array re-mat MATu of the sense latch SLT is set to the low level (0V), the node N1 in the side of the bit line of the data latch DLTu in the memory array re-mat MATu side is set to the low level (0V) and the node in the side of the bit line of the data latch DLTd in the memory array re-mat MATd side is set to the low level (0V).

When the write process of the data "1, 0" is completed, whether the threshold voltage of the memory cells corresponding to the data "1, 1" is changed or not is determined by applying the verification voltage to the word line (step S30). Thereafter, whether the threshold voltage of the memory cell corresponding to the data "1, 0" is changed or not and whether the threshold voltage of the memory cell corresponding to the data "0, 0" is changed or not are determined (step S31, S32). If there is no memory cell in which the threshold voltage is changed in above determination, the write process is completed normally and if there are memory cells in which the threshold voltage is changed, the write process is completed as the defective write process.

Figure 14:
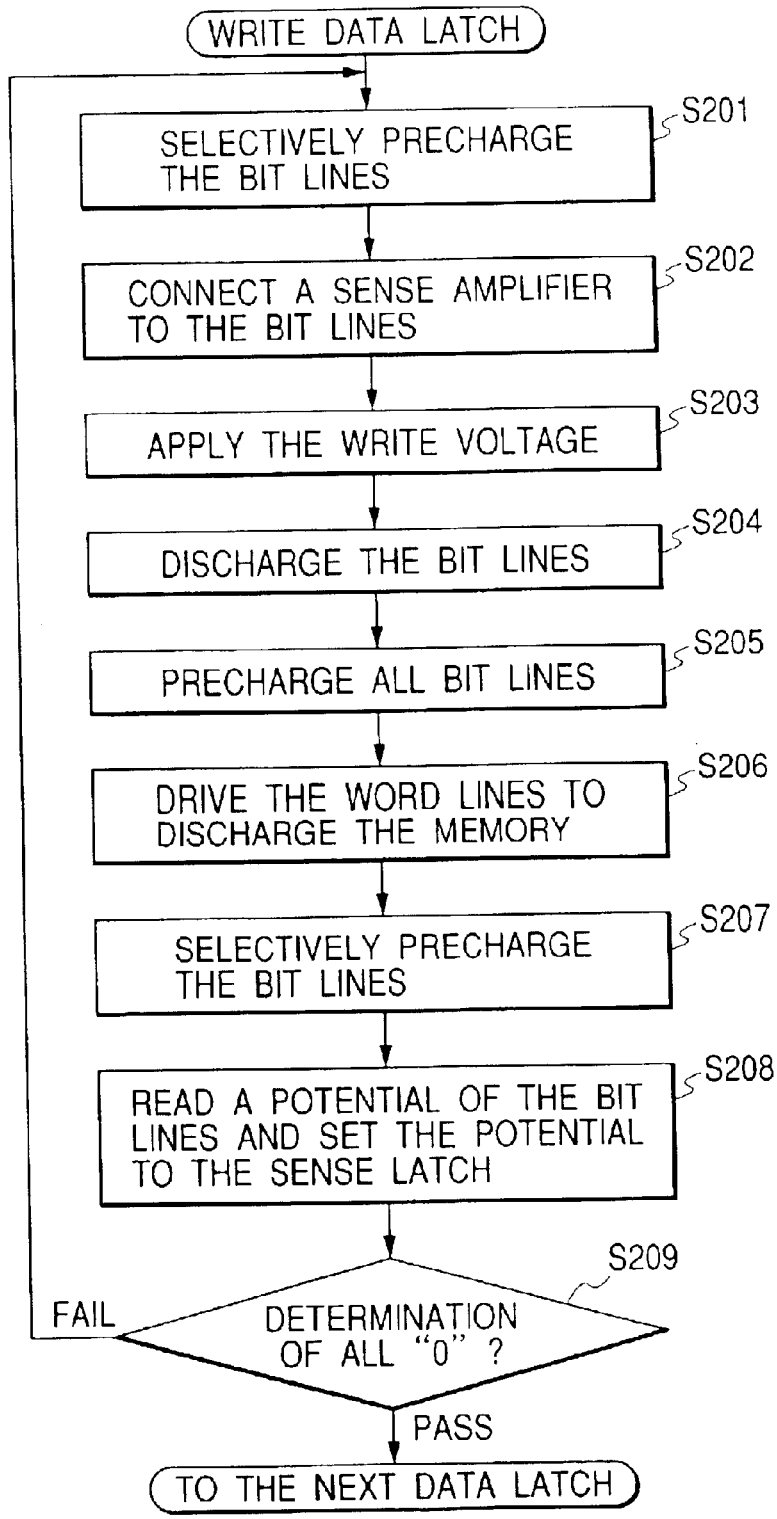
FIG. 14 is a flowchart showing a more detail procedure of the write process in FIG. 13.

FIG. 14 shows the more detail procedures of the write process executed in the step S22 and the verification process executed in the step S23.

When the latch of write data to the sense latch SLT in the step S21 is completed, the selective precharge is conducted based in the latch data of sense latch SLT (step S201). This selective precharge is conducted by turning ON the precharge MOSFET Qp1 with the control signal PC. If the latch data of the sense latch SLT is in the high level when the Qp1 is turned ON, since a voltage of the output node Nu (Nd) of the sense latch SLT is applied to the gate of the MOSFET Qc connected in series with the precharge MOSFET Qp1, the Qc is turned ON to recharge the bit line GBL to the high level.

Moreover, the selected MOSFET Qsb provided between the bit line GBL and the local drain line LDL of the memory column to be selected is turned ON depending on the write operation of the memory cells of the even-number columns or odd-number columns to simultaneously precharge the local drain line LDL. Meanwhile, in this timing, the selected MOSFET Qsb provided between the precharged local drain line LDL and the local drain line LDL in the opposite side and common drain line CDL is also turned ON to apply the voltage such as 5V to the local drain line LDL in the opposite side.

For the precharge of the bit line, the bit line GBL can be precharged to 0.8V by setting the control signal PC to the value of 0.8V+Vth (threshold voltage of Qp1). In principle, it is also possible to precharge in direct the bit line GBL with the sense latch SLT but it is probable, in this case, the sense latch SLT is erroneously inverted because a load capacitance of the bit line GBL is very large. However, such erroneous inversion of the sense latch can be avoided by indirect precharge as in the case of this embodiment. When the latch data of the sense latch SLT is in the low level, the bit line GBL is not precharged because the MOSFET Qc connected in series with the precharge MOSFET Qp1 is not turned ON.

Next, the control signal TR is raised up to the high level to turn ON the transfer MOSFET QtL (QtR) on the bit line GBL and thereby the sense latch SLT and the bit line GBL are connected to hold the selected precharge potential of the bit line GBL (step S202) In this case, the potential of the bit line GBL is clamped to 0.8V by setting the control signal TR to the value 0.8+Vth (threshold voltage of Qc) The reason why the sense latch SLT and bit line GBL are connected is that the potential of the non-selected bit line GBL can be stably set to 0V because the potential of the non-selected bit line GBL is floated with the coupling capacitance among the bit lines during the precharge with the precharge MOSFETs Qp1 and Qc.

Thereafter, the selected word line WL is raised up to a voltage as high as 14V and the assisting gate MOSFET Qa of the memory cells of the even-number columns or odd-number columns. Thereby the write process is executed by applying the write voltage to the memory element Qm of the memory cell for the predetermined time (step S203). The step S203 may be executed almost simultaneously with the process of step S202.

Upon completion of the write process, the control signal DDC is raised, under the condition that the transfer MOSFET QtL (QtR) is turned OFF, to turn ON the MOSFET Qd2 to discharge the bit line GBL and the selected MOSFET Qsd is turned ON, under the condition that the common drain line CDL is grounded, to discharge the local drain line LDL under the condition that the selected MOSFET Qsb in the bit line side is turned OFF (step S204).

Thereafter, the control signal RPC is raised to verify the write operation to turn ON the precharge MOSFET Qp2 to precharge at a time the all bit lines GBL in the selected memory mat side to the voltage of 0.8V (step S205). In this case, the MOSFET Qp2 is turned ON in the non-selected memory mat to precharge at a time all bit lines GBL to the voltage of 0.4V that is equal to a half of the voltage in the selected memory mat side.

Moreover, the selected MOSFET Qsb of the local drain line LDL is turned ON depending on the condition that the write process has been executed to the memory cells of the even-number columns or odd-number columns and thereby to precharge simultaneously the local drain lines LDL. On the other hand, the selected MOSFET Qsb among the precharged local drain line LDL, local drain line LDL in the opposite side and the common drain line CDL is also turned ON to apply the voltage of 0V to the local drain line LDL in the opposite dide.

Subsequently, the verification voltage is applied to the word line and the transfer MOSFETs Qt in the selected mat side and non-selected mat side are also turned ON to connect the bit line GBL to the sense latch SLT (step S206). In addition, the assisting gate MOSFETs Qa of the even-number column or the odd-number column are also turned ON. Thereby, the read operation of memory cells is executed. In this case, when the threshold voltage of the selected memory cells is high, a current does not flow and the bit line GBL maintains the precharge level. When the threshold voltage of the selected memory cells is low, a current flows and the bit line GBL is discharged and is then maintained at 0V. Subsequently, the bit line GBL connected to the non-selected memory cells is selectively precharged (step S207) to conduct the mask process for the non-selected memory cells. Finally, potential change of the bit line is compared with the potential of bit line of the non-selected mat with the sense latch and thereby read data can be detected (step S208).

According to the investigations by the inventors of the present invention, it has been proved that when the precharge system is introduced for the verification process in the memory array that is structured to execute the data write operation by providing the assisting gate MOSFET and then implanting the hot electrons to the floating gate of the memory element through application of the write reject voltage from the main bit line side, the logics of the write data and read data are inverted and the logic inversion process on the bit line is required but such logical inversion is not required in the memory array of the present invention.

Next, the "all zero" determination to detect whether the input/output nodes in the non-selected mat side of the sense latch are all in the low level or high level is conducted on the basis of the data latched in each sense latch SLT (step S209). This all-zero determination is conducted by determining with the all-zero determination circuit 35 whether the drain voltage of the MOSFET Qaz of which gate is connected to the bit line GBL is fallen to the low level or not. Since the drain of the MOSFET Qaz for all-zero determination is connected in common with each other, the potential of the common drain line is lowered if any one of the gate voltages is in the high level, the all-zero condition can be determined when the all-zero determination circuit 35 detects the potential of the common drain line.

When all-zero condition is determined, the data latch is conducted for the next data write process. When all-zero condition is not determined, the re-write process is conducted by returning to the step S201. In this case, the selective precharge of the bit line is executed based on the data remaining in the sense latch SLT. Namely, re-latch of the write data is never conducted.

Next, data read operation in the multi-level flash memory of this embodiment will be explained briefly.

Data read process is conducted in total of three times by changing the potential of word line for the half (even-number columns or odd-number columns) of the memory cells connected to one word line. As the voltages Vr1, Vr2, Vr3 applied to the word line during the read operations of three times, the value almost intermediate value of the threshold voltage distribution shown in FIG. 12(A) is selected, for example, as 1.5V, 2.8V and 4.2V. The read operations with these voltages are sequentially conducted from the high voltage to the lower voltage. However, it is also possible to conduct such process sequentially from the lower voltage to the higher voltage. The practical procedures of a single read operation are almost similar to that of the verification process at the time of write process. Namely, the bit line in the selected mat side is precharged to 0.8V, while the bit line of the non-selected mat side to 0.4V, respectively.

Difference between the data read process and verification process can be found in the point that the data detected with the sense latch SLT is transferred to the data latch DLT via the bit line in the data read process and it is then amplified up to 3.3V with the data latch and thereafter transferred to the main amplifiers 15a, 15b via the common I/O line. The three data amplified with the main amplifier are then transferred to the data control circuit 33, converted therein to the original 2-bit data and are then outputted from the external terminal.

In more detail, the three kinds of data read from only one memory cell through the first to third read operations based on the read voltages of Vr1, Vr2, Vr3 are as follows shown in the Table 1, based on the threshold voltage Vth of the selected memory cells. The data control circuit 33 regenerates the 2-bit data as shown in the right column of the Table 1 based on these data.

TABLE 1

| | Read Process Data | | | 2-bit |
| --- | --- | --- | --- | --- |
| | 1$^{st}$ (Vr1) | 2$^{nd}$ (Vr2) | 3$^{rd}$ (Vr3) | data |
| High Vth | 1 | 1 | 1 | "0, 1" |
| Rather High Vth | 0 | 1 | 1 | "0, 0" |
| Rather Low Vth | 0 | 0 | 1 | "1, 0" |
| Low Vth | 0 | 0 | 0 | "1, 1" |

Here, it is also possible to regenerate the 2-bit data based on the three kinds of read data in such a manner that the respective read data are latched with a pair of data latch and sense latch corresponding to only one bit line, the logical arithmetic operation is executed on the bit line to such data and the result of arithmetic operation is sent to the main amplifier after it is latched with a pair of data latches. Since the regeneration of initial 2-bit data with the logical arithmetic operation on the bit line can be realized with the known technique and it is not the subject matter of the present invention, such regeneration process is not explained here.

Accordingly, the operation, in which the data detected with the sense latch SLT is transferred to the data latch DLT via the bit line and it is then amplified up to the amplitude of 0 to 3V with the data latch, is then explained.

For the data read operation, the control signal RPC is raised first to turn ON the precharge MOSFET Qp2 in order to precharge at a time all bit lines GBL in the selected memory mat side up to the voltage of 0.8V. In this case, the MOSFET Qp2 in the non-selected side memory mat is turned ON to precharge at a time all bit lines GBL up to the voltage of 0.4V.

Moreover, the selected MOSFET Qsb of the local drain line LDL is also turned ON to simultaneously precharge the local drain line LDL. Meanwhile, the selected MOSFET Qs among the precharged local drain line LDL, the local drain line LDL in the opposite side and the common drain line CDL is also turned ON to impress the voltage of 0V to the local drain line LDL in the opposite side.

Subsequently, the read voltage is applied to the word line and the transfer MOSFETs Qt in the selected mat side and non-selected mat side are also turned ON to connect the bit line GBL to the sense latch SLT. Thereby, the read operation of the bit line GBL is conducted, a current does not flow when the threshold voltage of the selected memory cells is high, a current flows when the threshold voltage of the selected memory cells is low and the bit line GBL is discharged to 0V. The potential change of this bit line is compared with the potential of the bit line of the non-selected mat and thereby the read data can be detected.

The control signal PC is raised under the condition that the transfer MOSFET Qt in the sense amplifier on the bit line is turned OFF and the transfer MOSFET Qt' in the data latch side is turned ON in order to turn ON the precharge MOSFET Qp1 to conduct the selective precharge of bit line. In more practical, when the latch data of the sense latch SLT is in the high level when the MOSFET Qp1 is turned ON, since a voltage of the output node Nu (Nd) of the sense latch SLT is applied to the MOSFET Qc connected in series with the precharge MOSFET Qp1, Qc is turned ON to precharge the bit line GBL to the high level.

Moreover, in the precharge of the bit line for data read process, the bit line GBL can be precharged to 1.2V by setting the control signal PC to the value of 1.2+Vth (threshold voltage of Qp1).

Thereafter, the data latch can be activated by applying the power supply voltage of 3V to the data latch DLT under the condition that the transfer MOSFET Qt' on the bit line is turned OFF. Thereby, the signal having the amplitude of 0 to 1.2V can be amplified to the signal having the amplitude of 0 to 3V. The amplified read signal can be transferred to the main amplifier via the common I/O line CI/O by turning ON the Y gate MOSFETs Qy', Qy". Although not particularly restricted, in this embodiment, the amplified signal of the data latch DLT can be outputted in the differential mode.

The present invention has been explained with reference to the preferred embodiments but the present invention is not restricted thereto and allows of course various changes and modification within the scope of the claims thereof. For example, in the AG-AND type memory array of the embodiment shown in FIG. 5, two local drain lines LDL can be connected to only one bit line GBL via the selected MOSFET Qsb but the present invention can also be adapted, like the AND type memory array of the embodiment of FIG. 2, to the memory array wherein the local bit lines that can be connected or not connected to the bit line are provided and the memory cell column is structured by connecting in parallel a plurality of memory cells between these local drain lines. In this case, the current directions in the write operation and read operation can be matched and thereby virtual change of threshold voltage of the memory cell depending on the current flowing direction can be avoided. Moreover, in the embodiments, a multi-level flash memory has been explained as an example but the present invention can also be adapted to the binary flash memory.

In above explanation, the present invention is adapted to a flash memory which is the adequate application field as the background thereof, but the present invention is not restricted thereto and can also widely adapted to an ordinary non-volatile memory device using the MOSFET having the floating gate as the memory element.

The typical effects of the present invention disclosed in this specification will be briefly explained as follows.

Namely, according to the present invention, the total time required for the write operation can be shortened and the power consumption can also be reduced in the non-volatile memory device such as a flash memory.

What is claimed is:

1. A nonvolatile memory comprising:
   a plurality of word lines;
   a plurality of bit lines;
   a plurality of memory cells;
   a first switch circuit; and
   a control circuit,
   wherein each of said plurality of memory cells has a control terminal, a first terminal and a second terminal, a channel between said first terminal and said second terminal, and an electron storage area between said control terminal and said channel,
   wherein said control terminal of a first memory cell of said plurality of memory cells couples to a first word line,
   wherein said first terminal of said first memory cell is coupled to a first bit line of said plurality of bit lines and said second terminal of said memory cell is coupled to a first signal line,
   wherein said first bit line is coupled to a first sense amplifier via said first switch circuit, and
   wherein in a writing operation for writing data to said first memory cell, said control circuit controls charging of a first voltage to said first signal line, turning a switch of said first switch circuit to ON for connecting said first bit line to said first terminal of said first memory cell, coupling said first bit line to a ground level voltage, and then supplying a write voltage to said first word line coupled to said control terminal of said first memory cell.

2. A nonvolatile memory according to claim 1,
   wherein said plurality of memory cells include a second memory cell,
   wherein said first terminal of said second memory cell is coupled to a second bit line and said second terminal of said second memory cell is coupled to a second signal line, wherein said control terminal of said second memory cell is coupled to said first word line, wherein said second bit line is coupled to a second sense amplifier via a second switch circuit, and wherein in said writing operation, said control circuit controls charging of said first voltage to said second signal line, turning a switch of said second switch circuit to ON for connecting said second bit line to said first terminal of said second memory cell, coupling said second bit line to a second voltage which is higher than said ground level voltage and lower than said first voltage, and then supplying said write voltage to said first word line coupled to said control terminal of said first memory cell and said control terminal of said second memory cell, whereby data of said second memory cell can be different from data of said first memory cell when said writing operation is completed.

3. A nonvolatile memory according to claim 2, wherein each of said plurality of memory cells has a second control terminal above said channel between said control terminal and said first terminal thereof, wherein said second control terminal of said first memory cell is coupled to a first control line, and said second control terminal of said second memory cell is coupled to a second control line, and wherein said control circuit controls supplying of a control voltage to said second control terminal of said first memory cell via said first control line to enable said channel of said first memory cell, and controls supplying of said control voltage to said second control terminal of said second memory cell via said second control line to enable said channel of said second memory cell.

4. A nonvolatile memory according to claim 2, wherein said first terminal of said first memory cell connects to a first local bit line, wherein said first terminal of said second memory cell connects to a second local bit line, and wherein said first local bit line is coupled to said first bit line via said first switch circuit and said second local bit line is coupled to said second bit line via said second switch circuit.

5. A nonvolatile memory according to claim 4, wherein said control circuit controls said first switch circuit and said second switch circuit to be turned ON during said writing operation, and to be turned OFF after completion of writing operation.

6. A nonvolatile memory according to claim 5, wherein said second terminal of said first memory cell connects to a first local signal line, wherein said second terminal of said second memory cell connects to a second local signal line, and wherein said first local signal line is coupled to said first signal line via a third switch circuit and said second local signal line is coupled to said second signal line via a fourth switch circuit.

7. A nonvolatile memory according to claim 6, wherein said control circuit controls said third switch circuit and said fourth switch to be turned ON during said writing operation, and to be turned OFF after completion of said writing operation.

8. A nonvolatile memory according to claim 1, wherein said control circuit controls a verify operation for checking whether writing of data to said first memory cell is complete after said writing operation.

9. A nonvolatile memory according to claim 8, wherein when said control circuit detects that the writing of data is not completed, said control circuit repeats said writing operation.

10. A nonvolatile memory according to claim 9, wherein each of said plurality of memory cells has a threshold voltage within an arbitrary one of a plurality of threshold voltage ranges, wherein one of said threshold voltage ranges indicates an erase state and another of said threshold voltage ranges indicates a program state, and wherein in said verify operation, said control circuit checks whether the threshold voltage of said first memory cell is within the threshold voltage range indicating said program state.

11. A nonvolatile memory according to claim 10, wherein said program state is one of a plurality of program states each of which is allocated to a different threshold voltage range corresponding to different data.

12. A nonvolatile memory comprising:

a plurality of electrically erasable and programmable nonvolatile memory cells;

a plurality of word lines;

a plurality of signal lines;

a plurality of bit lines; and a plurality of switch circuits;

wherein said plurality of word lines and said plurality of bit lines are crossingly arranged;

wherein each of said nonvolatile memory cells has a control terminal, a first terminal and a second terminal, said control terminal is coupled to corresponding word line, said first terminal is coupled to corresponding bit line, and said second terminal is coupled to corresponding signal line, wherein a first bit line of said plurality of bit lines couples to a first amplifier via a first switch circuit of said plurality of switch circuits;

wherein a second bit line of said plurality of bit lines couples to a second amplifier via a second switch circuit of said plurality of switch circuits, and wherein in a writing operation, a first signal line coupled to a first memory cell and a second signal line coupled to a second memory cell are charged with a first voltage, both of said first switch circuit and said second switch circuit are turned OFF, while said first switch circuit and said second switch circuit are turned OFF said first bit line is charged with a second voltage corresponding to first data and said second bit line is charged with a third voltage corresponding to second data, and then a program voltage is supplied to one word line which is coupled to the control terminal of said first memory cell and the control terminal of said second memory cell.

13. A nonvolatile memory according to claim 12, wherein said second voltage is lower than said first voltage, and wherein said third voltage is lower than said second voltage.

14. A nonvolatile memory according to claim 13, wherein when a bit line is charged with said second voltage, a first quantity of current flows from a signal line to said bit line via a nonvolatile memory cell, wherein when said bit line is charged with said third voltage, a second quantity of current flows from said signal line to said bit line via said nonvolatile memory cell, and 15. A nonvolatile memory according to claim 1, further comprising a third switch circuit and a fourth switch circuit, wherein said third switch circuit is coupled between said first bit line and said first sense amplifier, and is turned OFF during coupling of said first bit line to said ground level voltage, and wherein said fourth switch circuit is coupled between said second bit line and said second sense amplifier, and is turned OFF during coupling of said second bit line to said second voltage.

* * * * *